United States Patent [19]
Yoshimori et al.

[11] Patent Number: 5,468,684
[45] Date of Patent: Nov. 21, 1995

[54] INTEGRATED CIRCUIT WITH LAYERED SUPERLATTICE MATERIAL AND METHOD OF FABRICATING SAME

[75] Inventors: Hiroyuki Yoshimori, Kanagawa; Hitoshi Watanabe, Tokyo, both of Japan; Carlos A. Paz De Araujo; Shuzo Hiraide, both of Colorado Springs, Colo.; Takashi Mihara, Saitama, Japan; Larry D. McMillan, Colorado Springs, Colo.

[73] Assignees: Symetrix Corporation, Colorado Springs, Colo.; Olympus Optical Co., Ltd., Tokyo, Japan

[21] Appl. No.: 65,666

[22] Filed: May 21, 1993

Related U.S. Application Data

[63] Continuation-in-part of Ser. No. 981,133, Nov. 24, 1992, Pat. No. 5,423,285, and Ser. No. 965,190, Oct. 23, 1992, abandoned, each is a continuation-in-part of Ser. No. 807,439, Dec. 13, 1991, abandoned.

[51] Int. Cl.$^6$ .................................................. H01L 21/465
[52] U.S. Cl. ............................................. 437/228; 437/190
[58] Field of Search ..................... 437/225, 228, 437/190; 257/295, 298

[56] References Cited

U.S. PATENT DOCUMENTS

| | | | |
|---|---|---|---|
| 4,149,301 | 4/1979 | Miller et al. | 29/25.42 |
| 5,046,043 | 9/1991 | Cook | 365/145 |
| 5,099,305 | 3/1992 | Takenaka | 365/145 |
| 5,104,822 | 4/1992 | Butler | 437/52 |
| 5,119,154 | 6/1992 | Gnadinger | 357/23.6 |
| 5,191,510 | 3/1993 | Huffman | 361/313 |

FOREIGN PATENT DOCUMENTS

| | | | |
|---|---|---|---|
| 0495991A1 | 7/1992 | European Pat. Off. | H01L 27/115 |
| 0155631 | 11/1989 | Japan | 437/231 |
| 0254143 | 3/1990 | Japan | 437/231 |
| 0249278 | 10/1990 | Japan . | |
| 2304796 | 12/1990 | Japan | G11C 11/22 |
| 4092468 | 3/1992 | Japan | H01L 27/112 |

OTHER PUBLICATIONS

Scott, J. F., et al. "Integrated Ferroelectrics", 1992 Condensed Matter News 1992, vol. 1., No. 3.
Sanchez, L. E., et al. "Process Technology Developments for GaAs Ferroelectric Nonvolatile Memory", McDonnell Douglas Electronic Systems Company, Huntington Beach, Calif.
Murarka, S. P. "Metallization", VLSI Technology, Second Ed., Chapt. 9 McGraw–Hill Book Company.
Mihara, Takashi, et al. "Feasibility for Memory Devices and Electrical Characterization of Newly Developed Fatigue Free Capacitors", 4th Annual Int'l Symposium on Integrated Ferroelectronics, 1992.

*Primary Examiner*—R. Bruce Breneman
*Attorney, Agent, or Firm*—Duft, Graziano & Forest

[57] ABSTRACT

A method of fabricating a ferroelectric or layered superlattice DRAM compatible with conventional silicon CMOS technology. A MOSFET is formed on a silicon substrate. A thick layer of BPSG followed by a thin SOG layer overlies the MOSFET. A capacitor is formed by depositing a layer of platinum, annealing, depositing an intermediate layer comprising a ferroelectric or layered superlattice material, annealing, depositing a second layer of platinum, then patterning the capacitor. Another SOG layer is deposited, contact holes to the MOSFET and capacitor are partially opened, the SOG is annealed, the contact holes are completely opened, and a Pt/Ti/PtSi wiring layer is deposited.

46 Claims, 18 Drawing Sheets

| | | | |
|---|---|---|---|
| 1-35 | CMOS PROCESS | 53 | 1ST METAL ETCH |
| 36 | WAFER PREBAKE | 54 | RESIST STRIP |
| 37 | SOG COAT | 55 | SOG COAT |
| 38 | SOG CURE | 56 | SOG CURE |
| 39 | SOG HARD BAKE | 57 | SOG HARD BAKE |
| 40 | 1ST METAL DEPO. | 58 | 1ST CONT PHOTO. |
| 41 | 1ST METAL ANNEAL | 59 | 1ST CONT ETCH. |
| 42 | FE COAT | 60 | RESIST STRIP |
| 43 | 1ST ANNEAL | 61 | 3RD ANNEAL |
| 44 | 2ND METAL DEPO. | 62 | 2ND CONT PHOTO |
| 45 | 2ND METAL PHOTO. | 63 | 2ND CONT ETCH |
| 46 | 2ND METAL ETCH. | 64 | RESIST STRIP |
| 47 | RESIST STRIP | 65 | NATURAL OXIDE ETCH |
| 48 | 2ND ANNEAL | 66 | 3RD METAL DEPO. |
| 49 | FE VIA PHOTO. | 67 | 3RD METAL PHOTO & ETCH |
| 50 | FE VIA ETCH. | 68 | RESIST STRIP |
| 51 | RESIST STRIP | 69 | FINAL ANNEAL |
| 52 | 1ST METAL PHOTO. | 70 | COMPLETE CMOS PROCESS & PACKAGING |

FIG.1

| | |
|---|---|
| 66A | DEPOSIT 1ST WIRING LAYER |
| 66B | MOS ANNEAL (LOW TEMP) |
| 66C | 1ST WIRING LAYER PHOTO |
| 66D | 1ST WIRING LAYER ETCH |
| 66E | RESIST STRIP |
| 66F | DEPOSIT 2ND WIRING LAYER |
| 66G | 2ND WIRING LAYER PHOTO |
| 66H | 2ND WIRING LAYER ETCH |
| 66I | RESIST STRIP |
| 66J | DEPOSIT 3RD WIRING LAYER |

FIG.2

INTEGRATED CIRCUIT WITH LAYERED SUPERLATTICE MATERIAL AND METHOD OF FABRICATING SAME

This application is a continuation-in-part of U.S. patent application Ser. No. 07/981,133 filed Nov. 24, 1992, now U.S. Pat. No. 5,423,285, and Ser. No. 07/965,190 filed Oct. 23, 1992, now abandoned, which in turn are continuations-in-part of U.S. patent application Ser. No. 07/807,439 filed Dec. 13, 1991, now abandoned.

BACKGROUND OF THE INVENTION

1. Field of the Invention

The invention in general relates to the structure and fabrication of integrated circuits and more particularly to an integrated circuit structure and fabrication method in which layered superlattice electronic components can be integrated into conventional MOS technology.

2. Statement of the Problem

It has long been known that ferroelectric materials offer the possibility of simple, low cost, high density, non-volatile memories that are highly resistant to radiation damage and which can be written to and read utilizing the low voltage levels utilized in conventional volatile memories. See for example U.S. patent application Ser. No. 07/919,186 which is hereby incorporated by reference. However, despite over 30 years of research, no ferroelectric memories have had significant commercial success. A key reason for this lack of success has been that ferroelectric materials fatigue relatively rapidly when switched often as typically occurs in a memory. However, recently a new class of materials, called layered superlattice materials, that have as much as 10,000 times the resistance to fatigue as prior ferroelectric materials have been discovered. See U.S. patent application Ser. No. 07/965,190 which is hereby incorporated by reference. Many of these superlattice materials have also been found to have high dielectric constants and low leakage current, which suggests that they should perform well as the dielectric material in otherwise conventional volatile memories.

It would be highly desirable to utilize the new low-fatiguing ferroelectric and high dielectric constant layered superlattice materials in one of the most common, simple, and most dense integrated circuit devices, the DRAM (Dynamic Random Access Memory). DRAM circuits comprise arrays of memory cells, each cell comprising two main components: a field effect transistor (FET) and a capacitor. In the most common Circuit designs, one side of the transistor is connected to one side of the capacitor, and the other side of the transistor and the transistor gate are connected to external connection lines called the bit line and word line, respectively. The other side of the capacitor is connected to a reference voltage. Information is stored in the individual cell by placing a voltage across the capacitor which causes it to store a charge. The transistor provides a switch to access the capacitor. Thus the fabrication of the DRAM cell essentially comprises the fabrication of a transistor, a capacitor, and three contacts to external circuits. If the high dielectric constant layered superlattice materials could be incorporated into capacitors in otherwise conventional silicon DRAM technology, then DRAMs of much higher density could be made. If the low-fatigue ferroelectric layered superlattice materials could be incorporated in the capacitors of conventional silicon DRAMs, then low-fatigue, dense, non-volatile memories would be possible.

However, when known silicon integrated circuit technology is applied to ferroelectric materials, including the layered superlattice materials, either the performance of the ferroelectric materials or the properties of the convention silicon materials tends to degrade. For example, when ferroelectric materials are utilized with a conventional DRAM structure, such as shown in Japanese patent publication 2-304796, some elements of the ferroelectric material tend to diffuse into the silicon devices and alter their performance. Thus in the most successful of the prior art ferroelectric devices, the ferroelectric materials have been separated from the silicon devices by relatively thick diffusion barriers, typically made of silicon nitride. Further, platinum, which is generally compatible with ferroelectrics, is selected as the material adjacent to the ferroelectric material. See for example, U.S. Pat. No. 5,046,043 issued to William D. Miller, et al. Moreover, the ferroelectric layers also have generally been set off at some distance from the silicon devices by thick oxide layers and other layers. The above solution leads directly to a second problem, the fact that platinum tends to peel off of silicon dioxide and other conventional insulators used in silicon technology. This problem is solved by incorporating a thin "adhesive" layer of titanium between the platinum and the insulator. As another example of the incompatibility of the ferroelectric materials With conventional silicon technology, when ferroelectric capacitors have been connected to transistors in the conventional DRAM manner, i.e. by a metal layer connecting the bottom of the capacitor with a transistor source/drain active area on the silicon substrate, the ferroelectric materials have tended to crack; this is believed to be caused by the facts that ferroelectric materials must be annealed at relatively high temperatures, and the connecting metal expands and contracts during the ferroelectric anneal step. One attempted solution to this problem has been the addition of an isolation layer of titanium dioxide. See the Miller patent cited above. However, the titanium introduced in either the adhesive or isolation layer has been found to degrade the performance of layered superlattice materials.

Researchers have also attempted to incorporate ferroelectric materials into gallium arsenide-based integrated circuit technology. However, it has been found that gallium arsenide is unstable at the annealing temperatures of the ferroelectric materials, and arsenic containing gases escape during the annealing process and contaminate the ferroelectric. One attempt to overcome this problem included the complete sealing of the gallium arsenide transistors in a layer of silicon, followed by the formation of the ferroelectric capacitor on an insulating oxide layer deposited over the silicon, and then, after the annealing process and the patterning of the capacitor, the connection of the capacitor to the active area. Since the capacitor is already formed, the connection is made to the upper side of the bottom electrode. See "Process Technology Developments For GaAs Ferroelectric Nonvolatile Memory" by L. E. Sanchez et al., and "Integrated Ferroelectrics" by J. F. Scott et al., in *Condensed Matter News*, Vol. 1, No. 3, 1992. This process does not appear to be applicable to silicon technology however, not only because silicon does not have the outgassing problem, but also because the resulting structure is highly nonplanar causing problems in applying the metallization layers with conventional technology, such as ion milling. See section 4.3 of the Sanchez paper just cited. Moreover, even if metallization is possible, the conventional silicon integrated circuit structure of transistors deeply imbedded in BPSG and a planarized metallization layer at the surface of the BPSG providing ease in making electrical connection to the integrated circuit components, is not achieved. Compare for example the metallization in the Sanchez paper with the conventional silicon integrated circuit metallization such as shown in *VLSI Technology*, second edition, edited by S. M. Sze, McGraw-Hill Book Company, Chapter 9, p. 376.

3. Solution to the Problem

The invention solves the above problems by providing an integrated circuit structure and fabrication method in which ferroelectric materials and layered superlattice materials are incorporated into conventional DRAM technology. A conventional MOS transistor is fabricated on a silicon substrate, and conventionally covered with a first insulating layer. Then a capacitor utilizing a layered superlattice material or other ferroelectric material is fabricated and covered with a second insulating layer. Contact holes are opened through the first and second insulating layer, and a wiring layer is deposited to form a conventional DRAM contact structure.

The problem of degradation of the characteristics of the ferroelectric material in the prior art processes is solved by depositing a relatively thin layer of spin-on glass (SOG) over the conventional BPSG first insulating layer. The capacitor is formed on the SOG.

Both electrodes of the capacitor and the intermediate layer of ferroelectric or layered superlattice material are patterned only after the complete capacitor is formed. This has been found to be important in preventing cracking. The electrodes and the intermediate layer may be patterned in any order.

The wiring layer, which tended to cause cracking and peeling problems when the ferroelectric capacitors were formed on it in the prior art, is only formed after the ferroelectric capacitor is deposited, patterned, and encapsulated in a second insulating layer. Preferably, the second insulating layer is also SOG. The portion of the wiring layer contacting the transistor active area penetrates the first and second insulating layers, the portion contacting the capacitor penetrates the second insulating layer, and the portion connecting the contact portions overlies the second insulating layer.

Preferably the wiring layer is multilayered, having a first layer of platinum silicide, a second layer of a metal such as titanium, and a third layer of platinum, although other metals may be used.

In the above structure, SOG completely surrounds the capacitor, except were the wiring layer contacts penetrate the second insulating layer. It has also been found that $Si_3N_4$ can be substituted for the SOG in the insulators, although SOG is preferred.

The problem of the degrading of the performance of layered superlattice materials by titanium has been solved by utilizing bottom electrodes consisting essentially of platinum. The SOG/platinum interface does not have the peeling problems of the prior art silicon oxide/platinum interfaces.

Another important factor in eliminating cracking and peeling is a multi-step treating process for the SOG. Preferably the SOG insulator is heated in three or more steps, the temperature of each heating step being at a higher temperature than the previous heating step. Ramping the temperature up and down within each heating step is also beneficial.

The process of making the contact holes for the wiring layer is also important in producing high-quality devices compatible with conventional silicon technology. Preferably, all the contact holes are made in a single process comprising contact hole process steps. That is, intermediate layering steps do not occur between making different contact holes. Preferably, a multiple etch process is used, performing a first etch through a first mask pattern to form a contact hole to the capacitor and initiate the contact hole to the transistor, then performing a second etch through a second etch pattern to complete the contact hole to the transistor active area. Preferably, the contact hole size in said second mask pattern is equal to or smaller than the contact hole size of said first mask pattern. The multiple etch process prevents possible short circuits between the wiring layer and other circuit elements.

It has also been found that the annealing processes are critical in forming high quality devices. The ferroelectric layer is annealed immediately after depositing it, as in the prior art. Preferably each of the capacitor electrodes is also annealed after deposition. Of key importance is an anneal of the second insulating layer prior to deposition of the wiring layer. Preferably, this second insulating layer anneal takes place between the two contact hole etches.

A low temperature anneal, preferably in a mixture of nitrogen and hydrogen gases, between the deposition of the first wiring layer and the second wiring layer returns the MOS devices to substantially their electrical characteristics without the ferroelectric or layered superlattice processes.

The above processes incorporate conventional silicon MOS technology in the processes other than the anneals and bakes. For example, wet etches are used in the contact process. Ion milling is used in the capacitor and metal patterning processes. Conventional MOS materials, such as SOG and BPSG are utilized. The resist and photo processes also are conventional.

In all of the annealing steps, except the MOS recovery annealing step, the MOS circuit is enclosed by thick BPSG and SOG layers. Yet no special isolation or barrier layers, other than the BPSG and SOG which are common in silicon MOS technology, are needed.

In summary, the processes and integrated circuit structures of the invention are much closer to the conventional MOS integrated circuit structures and processes than prior ferroelectric device structures and processes. At the same time, the electronic performance of the individual MOS devices within the integrated circuit fabricated according to the invention is within a few percent of the performance of pure MOS devices, and the electronic performance of the ferroelectric and layered superlattice devices are within 10% of the performance of simple ferroelectric and layered superlattice test devices. Insofar as known, this has never before been accomplished with ferroelectric devices and high dielectric constant materials. Numerous other features, objects and advantages of the invention will become apparent from the following description when read in conjunction with the accompanying drawings.

BRIEF DESCRIPTION OF THE DRAWINGS

FIG. 1 is a flow chart showing the steps of the process according to the invention;

FIG. 2 is a flow chart showing the steps of the 3rd metal or wiring layer deposition process;

DESCRIPTION OF THE PREFERRED EMBODIMENT

1. Overview.

Figure 15:
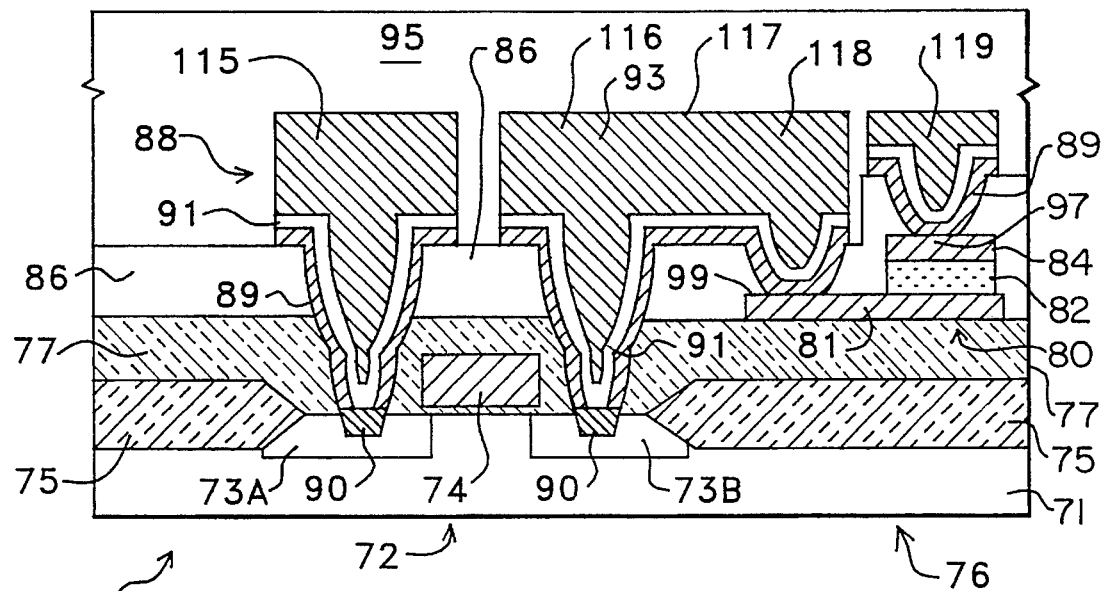
FIG. 15 shows a cross-sectional view of the wafer of FIG. 14 after the wiring layer has been patterned in the 3rd metal photo mask and etch, a resist strip, planarization of the wiring layer, and deposition of an insulating capping layer.

Turning now to FIG. 15, a cross-sectional view of a portion of an integrated circuit 100 according to a preferred embodiment of the invention is shown. It should be understood that the figures depicting the integrated circuit are not meant to be actual cross-sectional views of any particular portion of an actual semiconducting device, but are merely idealized representations which are employed to more clearly and fully depict the structure and process of the invention than would otherwise be possible. The portion of the integrated circuit 100 shown represents one DRAM memory cell 76 which includes a transistor 72 and a capacitor 80. Integrated circuit 100 includes a substrate 71, preferably a single crystal silicon wafer, on which transistor 72 is formed. Transistor 72 comprises source/drain active areas 73A and 73B, formed by doping areas of substrate 71, and gate 74. Integrated circuit 100 further includes field oxide areas 75, and first insulating layer 77 on which capacitor 80 is formed. First insulating layer 77 is shown in more detail in FIG. 4 and includes gate oxide 77A and thermal oxide 77B which, as is well-known, are formed in different steps but essentially merge because they are made of the same material. First insulating layer 77 further preferably includes an APCVD NSG (atmospheric pressure chemical vapor deposited non-doped silicon glass)layer 77C, a BPSG (borophosphosilicate glass) layer 77D, and a SOG (spin-on glass) layer 77E. Returning to FIG. 15, capacitor 80 includes first electrode 81, intermediate layer 82, which may be a ferroelectric or a layered superlattice material which may be ferroelectric or not be ferroelectric and which generally is a high-dielectric constant material, and second electrode 84. Second insulating layer 86 overlies the capacitor 80, and wiring layer 88, often referred to as a metallization layer, connects the active area 73B with first electrode 81 of capacitor 80, and active area 73A and second electrode 84 with other portions of the circuit. Wiring layer 88 is preferably a multilayered structure including a first layer 90 in contact with the active area 73A and 73B, a second layer 91, and a third layer 93 which contacts the surfaces 99 and 97 of capacitor electrodes 81 and 84 respectively. A capping layer 95, preferably phosphorous-doped SOG, completes the layered structure of the integrated circuit. As is well-known, such integrated circuits 100 are generally made on a wafer which is subsequently sawed in to hundreds of individual integrated circuit chips, each chip containing thousands or millions of cells 76. Each chip is then packaged to produce the finished integrated circuit.

Those skilled in the art will recognize that, unlike prior art ferroelectric integrated circuit chips, the completed integrated circuit 100, closely resembles a conventional MOS DRAM chip having MOS transistors deeply buried in oxides such as BPSG, and a planar wiring layer making contact to the memory cells 76. Although the capacitor 80 is not as deeply buried as the capacitors in conventional DRAM integrated circuits, this will not alter the reliability since the ferroelectric and layered superlattice capacitors are much more highly resistant to radiation damage than conventional DRAM capacitors.

As will be seen in more detail below, although the combination of processes and materials and the sequencing of the processes is novel, except for the ferroelectric and layered superlattice materials, the individual processes and materials used are ones that are well-known to those skilled in the art in MOS DRAM technology. It will also be seen from the data presented in FIGS. 22 through 36 that the structures and processes of the invention result in integrated circuits with excellent electronic properties. Thus, utilizing the structures and processes of the invention, it should be possible to manufacture high performance ferroelectric and layered superlattice integrated circuits in already existing MOS fabrication facilities.

2. Detailed Description of the Preferred Process and Structure

As mentioned above, the intermediate layer 82 of the capacitor 80 may be a ferroelectric material or a layered superlattice material. The ferroelectric materials may be PZT and other materials which are not layered superlattice materials. The layered superlattice materials include materials that are ferroelectric at room temperature, such as strontium bismuth tantalate, strontium bismuth niobate, strontium bismuth tantalum niobate, and lead bismuth niobate, as well as materials that are not ferroelectric at room temperature, such as barium bismuth tantalate, lead bismuth tantalate, and barium bismuth niobate. The layered superlattice materials, and in particular the latter three materials just named, tend to have relatively high dielectric constants, i.e. dielectric constants higher than 50. In more general terms the layered superlattice materials comprise complex oxides of metals, such as strontium, calcium, barium, bismuth, cadmium, lead, titanium, tantalum, hafnium, tungsten, niobium zirconium, bismuth, scandium, yttrium, lanthanum, antimony, chromium, and thallium that spontaneously form layered superlattices, i.e. crystalline lattices that include alternating layers of distinctly different sublattices. Generally each layered superlattice material will include two or more of the above metals; for example, barium, bismuth and niobium form the layered superlattice material barium bismuth niobate, $BaBi_2Nb_2O_9$. The material 30 may be a dielectric, a ferroelectric, or both. If it is a dielectric, the capacitor 16 is a dielectric capacitor, and if the material 30 is a ferroelectric, then capacitor 16 is a ferroelectric capacitor. The layered superlattice materials may be summarized most generally under the formula:

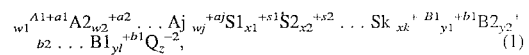

where A1, A2 . . . Aj represent A-site elements in the perovskite-like structure, which may be elements such as strontium, calcium, barium, bismuth, lead, and others S1, S2 . . . Sk represent super-lattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2W2 \ldots +ajwj)+(s1x1+s2x2 \ldots +skxk)+(b1y1+b2y2 \ldots +bjyj)=2z \qquad (2)$$

The preferred process according to the invention is described below. In conjunction with the description of the process, data shown in FIGS. 22–26 and 28–36 illustrating various aspects of the invention is also discussed. These figures include hysteresis curves, such as those shown in FIG. 22. The hysteresis curves are given in terms of the applied voltage in volts versus the polarization charge in microcoulombs per centimeter squared. Generally, the hysteresis is shown for several different voltages, usually, 2 volts, 4 volts, 6 volts, 8 volts, and 10 volts. In figures such as FIG. 22 where several hysteresis curves are shown, the scale is shown only for the lowest curve, although it is the same for the others. Generally, the values of the polarizability, 2Pr, in microcoulombs/$cm^2$, and the positive and negative coercive fields, Ec+ and Ec−, in kV/cm, are given alongside the hysteresis curves. The hysteresis measurements were all made on an uncompensated Sawyer-Tower circuit unless otherwise noted. The polarization charge, 2Pr, is the charge created by fully switching a capacitor, such as 80 (FIG. 15) from a state where it is polarized in one direction, say the upward vertical direction in FIG. 15 to the opposite polarized state, which would be the downward vertical direction in FIG. 15. Unless otherwise noted, the value of 2Pr given is taken from the hysteresis measurement at the highest voltage and is given in microcoulombs per $cm^2$. The higher the value of 2Pr, the better will be the performance of the material in ferroelectric memories and most other applications. The coercive field is a measure of the size of the field that is required to switch the material from one polarization state to another and the values given are in kilovolts per cm. The negative coercive field, Ec−, is the point at which the hysteresis curve crosses the field axis (the x-axis) on the negative side of the hysteresis curve and the positive coercive field, Ec+, is the value at which the hysteresis crosses the field axis on the positive side. For a practical electronic device, the coercive field should be high enough that stray fields will not cause polarization switching, but if it is too high, large voltages will be required to operate the device. Other parameters and terms used in the figures and discussion are either explained when the figure is discussed or should be clear from the context.

Figure 3:
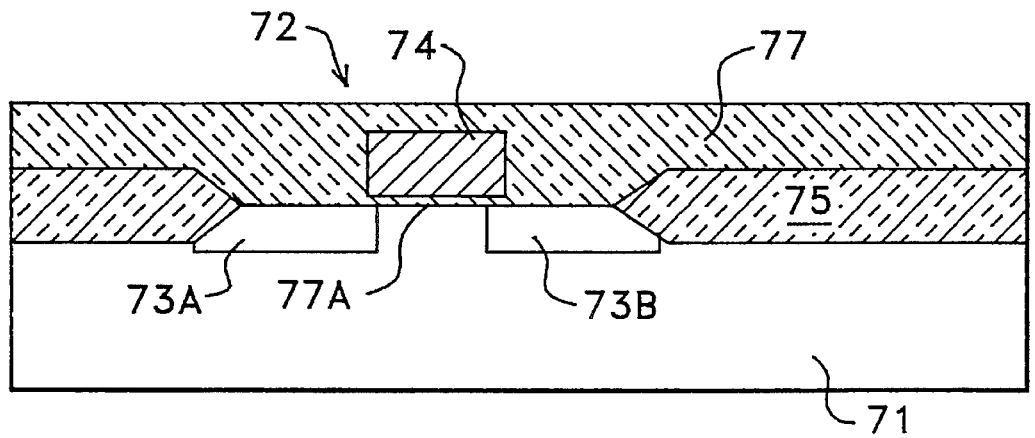
FIG. 3 shows a cross-sectional view of a portion of a partially fabricated MOS integrated circuit according to the preferred embodiment of the invention comprising a silicon substrate, doped wells formed in the substrate, field oxide regions, a transistor, and an insulating layer overlying the transistor.
Figure 4:
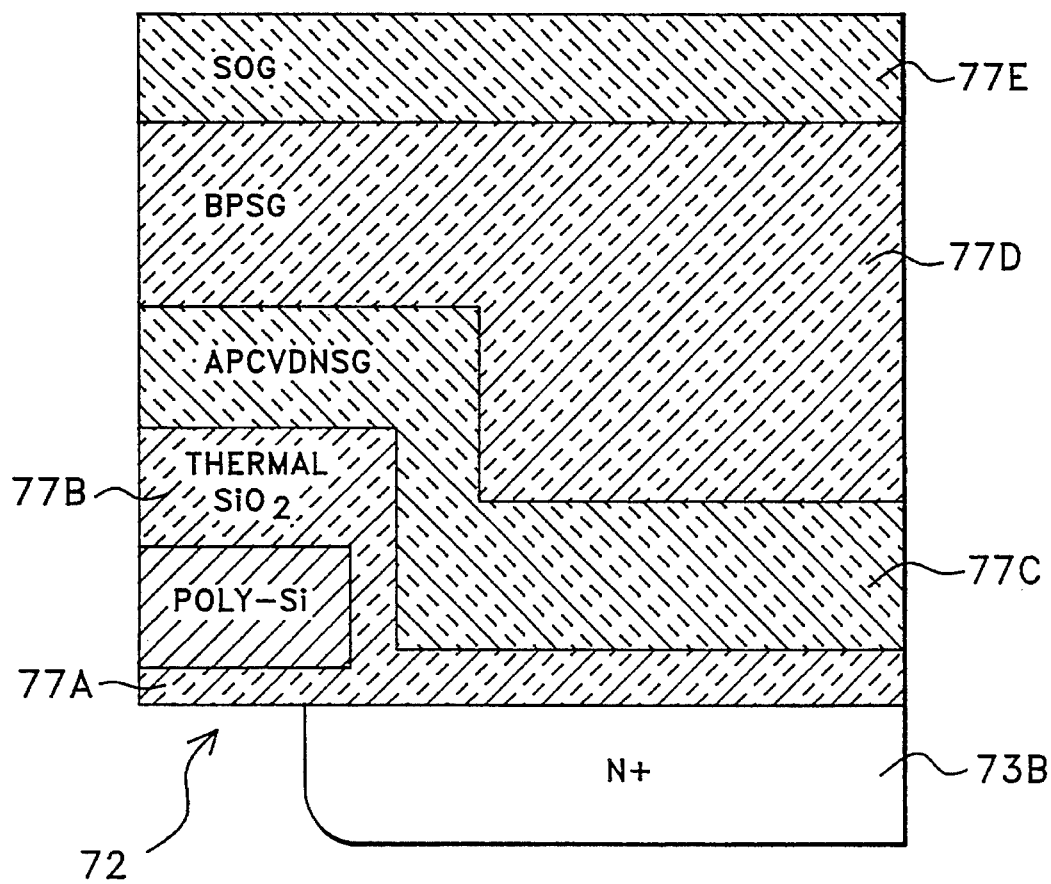
FIG. 4 is an expanded cross-sectional view of a portion of the MOS wafer of FIG. 3 illustrating in more detail the structure of the insulating layer overlying the capacitor after the first SOG layer has been deposited.
Figure 14:
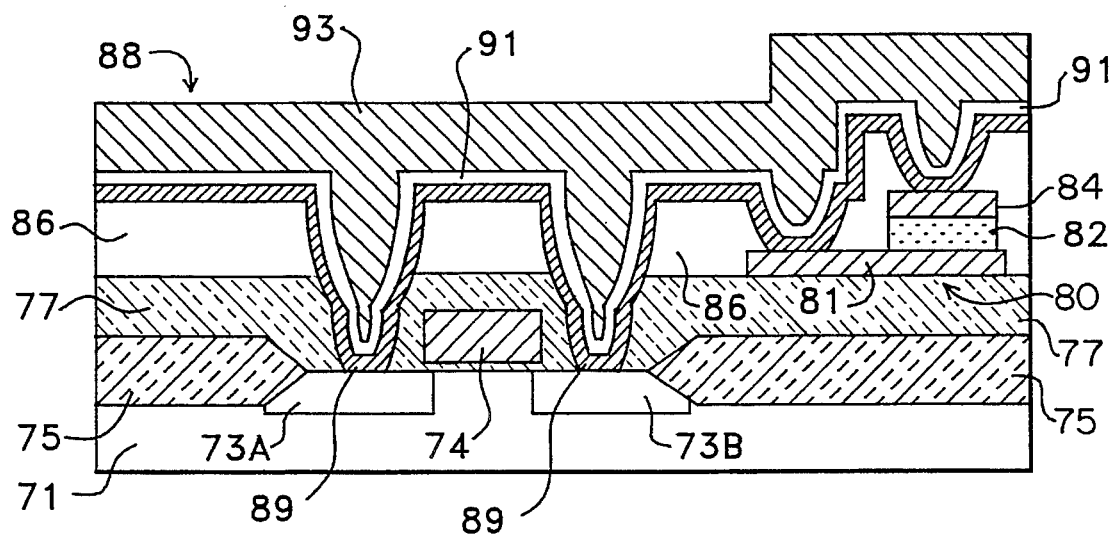
FIG. 14 shows a cross-sectional view of the wafer of FIG. 13 after the 2nd and 3rd wiring layers have been deposited.

Turning to FIGS. 1 and 3, the preferred process includes approximately 35 conventional CMOS process steps which result in the structure shown in FIG. 3, followed by steps 36 through 69, some of which represent multiple step processes, which comprise the novel portion of the invention and result in the structure shown in FIG. 14, plus conventional CMOS completion steps 70. The CMOS structure produced by the initial 35 steps includes a substrate, preferably single crystal silicon, active area wells 73A and 73B which in the embodiment shown are N+ doped in the case of NMOS structures, field oxide area 75, gate insulator 77A, preferably silicon dioxide, gate 74, preferably made of polysilicon, and insulating layer 77, which will be referred to herein as the "first insulating layer" as it is the first of the insulating layers that is structured by the novel process and materials of the invention. As shown in FIG. 4, in the conventional CMOS process used, the first insulating layer 75 includes a thermal oxide layer 77B overlying the transistor 72, an APCVD NSG 77C overlying the thermal oxide 77B, and a layer of BPSG 77D overlying the APCVD NSG 77C.

Figure 22:
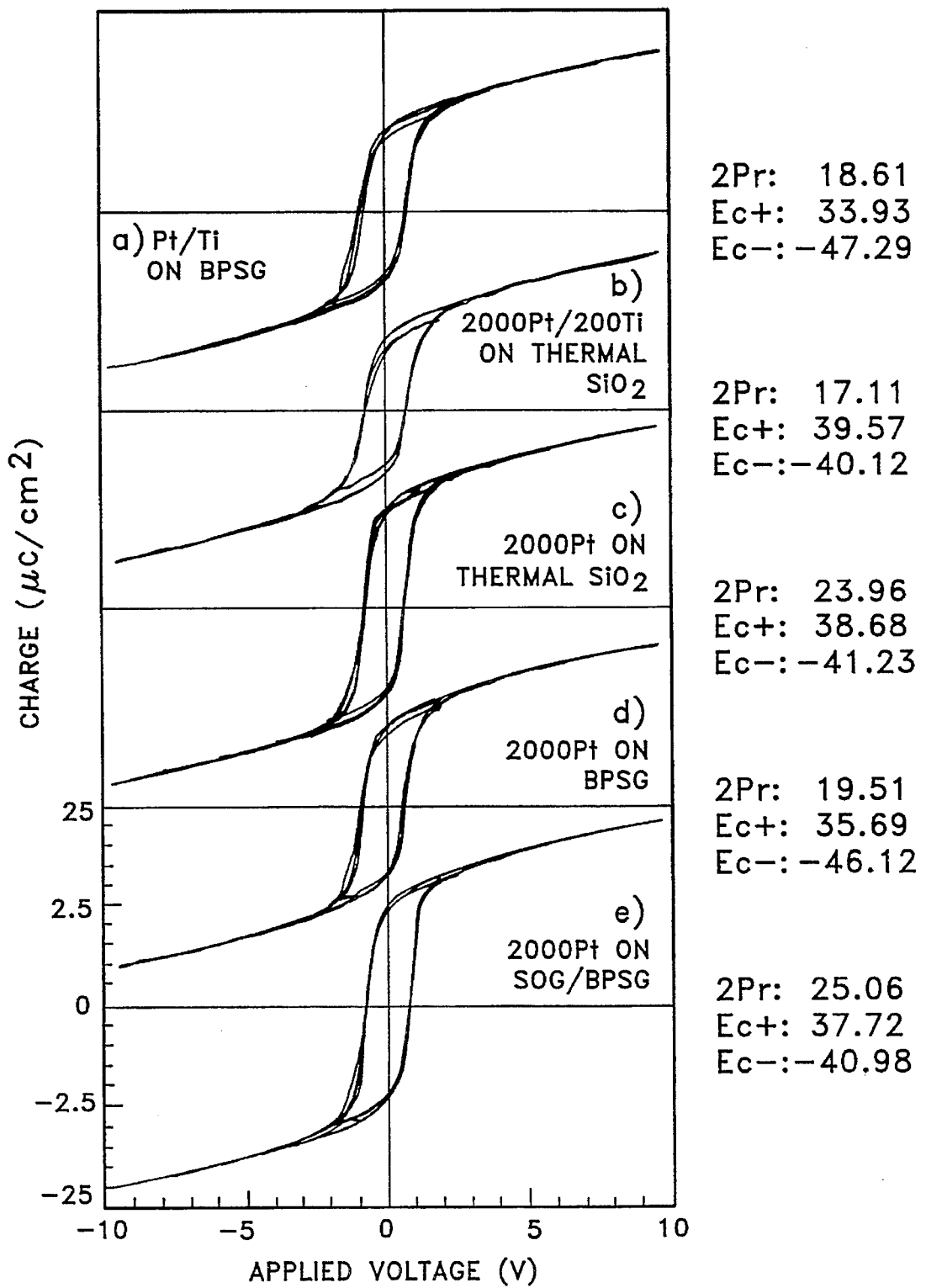
FIG. 22 shows hysteresis curves at 2, 4, 6, 8, and 10 volts for several different interfaces between the first insulating layer and the first capacitor electrode and gives the values of 2Pr, Ec+ and Ec− measured for the 10 volt hysteresis curve for each set of curves.

As shown in the (a) curve of FIG. 22, the prior art teaching of utilizing a platinum/titanium electrode results in a polarizability, 2Pr, of 18.61. This is significantly lower than the 24 to 25 achieved in test capacitors run without the CMOS process. Moreover, since significant processing steps remain, it can be expected that the polarizability will drop even further by the time the complete integrated circuit is fabricated. The Pt/Ti electrode tended to give uniformly poor results on other surfaces also, as indicated in curve (b) of FIG. 22. A platinum only electrode gave good results on thermal $SiO_2$, but thick thermal $SiO_2$ layers are not consistent with the conventional CMOS processing. Platinum on the conventional BPSG layer also did not give good results. Clearly, BPSG was somehow degrading the results. This could have been because of outgassing of the phosphorous and boron in the BPSG during anneal, similar to the outgassing of arsenic in gallium arsenide as reported in the prior art. However, it was guessed that the degradation was due to the shrinkage of the BPSG during anneal. It was proposed that a thin layer of SOG over the BPSG would provide a buffer to the shrinkage of the BPSG, and as shown in curve (e) of FIG. 22, this not only proved to be correct, but the SOG increased the polarizabilities even over the thermal oxide results. There are a variety of different SOG products available, including silicate SOGs such as the ACCUGLASS 111™ available from Allied Chemical and phosphosilicate SOGs, such as ACCUGLASS P114A™, also available from Allied Chemical. The silicate SOGs, such as ACCUGLASS 111™, has been found to provide the best results to date for the buffer layer 77E. The 111™ material includes methyl siloxane polymers with about 10% by weight —$CH_3$. A thickness of about 1000 Å gives a good result, i.e. a 2Pr of 24.58. The result seems to decrease slightly with layers of 2000 Å though the change is so small it could be do simply to sample variations. The decrease is significant at 3000 Å, however. Thus, SOG layers 77E of about 1000 Å are preferred.

Figure 5:
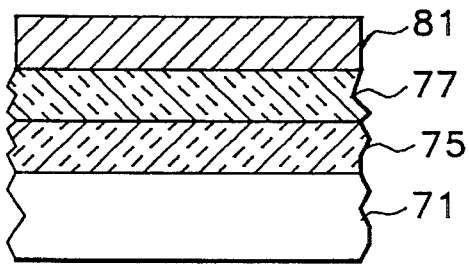
FIGS. 5 through 10 show cross-sectional views of a portion of the wafer of FIG. 3 illustrating the fabrication of the capacitor on the first SOG layer.
Figure 6:
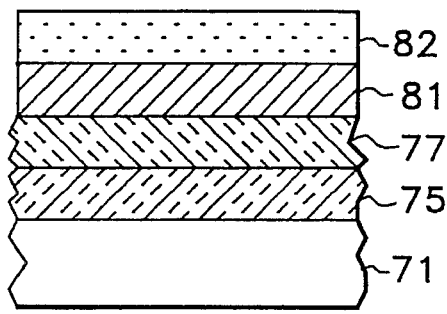
Figure 7:
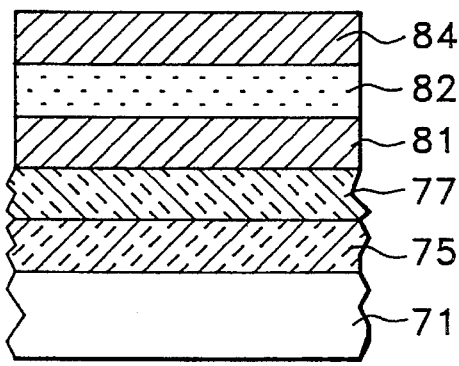

Based on the above, the preferred process according to the invention includes a wafer prebake at 800° C. for thirty minutes in oxygen, followed by a spin-on-glass coating at 1500 RPM for 30 seconds, preferably 1 coating of about 1000 Å thickness. The SOG is then dried and cured in a "multi-step anneal" process by baking in a furnace at 450° C. for 60 minutes in nitrogen followed by a hard bake at 800° C. in oxygen for 30 minutes. As will be discussed in more detail below, in a multi-step anneal process, the temperature is preferably ramped up and down in three or more steps in the drying, cure, and the bake processes, and thus the temperatures and times given are only the highest temperature and the time for that temperature within each process. 2000 Å of platinum is then deposited by sputtering in the 1st metal deposition step 40 to form the first electrode 81 (FIG. 5). There follows a 1st metal anneal at 800° C. for 30 minutes in oxygen. This anneal is optional, though it is included in the preferred embodiment.

Tests of platinum/titanium electrodes at various annealing temperatures suggest that the poor performance of the Pt/Ti electrodes is due to a roughening of the surface of the platinum layer due to the formation of projections made of $PtTi_x$. It has been found that annealing the Ti before sputtering of the platinum significantly decreases the projections. Thus, the use of a conventional Pt/Ti first electrode 81 may be considered providing the titanium is annealed before depositing the platinum.

Figure 8:
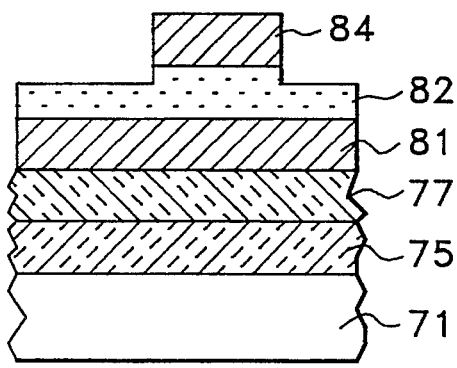
Figure 9:
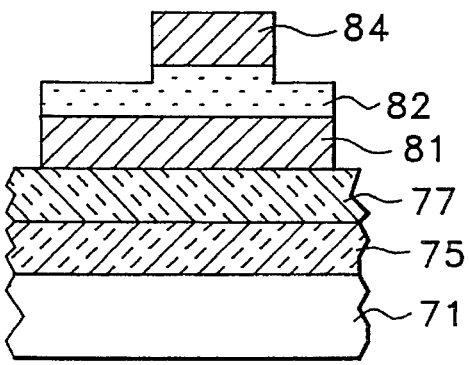
Figure 10:
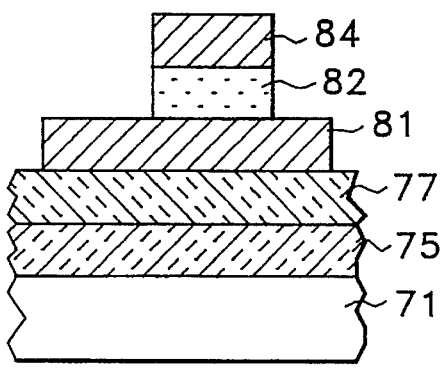

Turning to FIGS. 5 through 10 and FIG. 1, the process continues with the deposition of intermediate layer 82 which may be a ferroelectric, particularly one of the layered superlattice ferroelectrics, or may be a layered superlattice high dielectric constant material that is not ferroelectric. It is noted that most of the ferroelectric layered superlattice materials also have high dielectric constants. The layer 82 is preferably formed by the process described in U.S. patent applications Ser. No. 07/981,133 now U.S. Pat. No. 5,423,285 and Ser. No. 08/065,656, now U.S. Pat. No. 5,434,102, which are hereby incorporated by reference. In all the examples herein, the material selected was strontium bismuth tantalate ($SrBi_2Ta_2O_9$) with 10% excess bismuth in the precursor solution. The precursor solution is applied to the wafer by spin coating at 1500 RPM for 30 seconds. Then follows the 1st anneal of the ferroelectric/layered superlattice material 81, which is preferably at 800° C. for 60 minutes in oxygen. Then follows the 2nd metal deposition, step 24, in which 2000 Å of platinum is deposited by sputtering to form the second electrode 84 (FIG. 5). There follows the 2nd metal photo mask step and 2nd metal etch, which includes conventional resist deposition, photo mask, and ion milling etch steps followed by a resist strip. As indicated in FIG. 8, the ion milling may proceed partially into the layer 82. Then follows a preferred but optional anneal at 800° C. for 30 minutes in oxygen, which is called the 2nd anneal as it is the 2nd anneal after the ferroelectric or layered superlattice layer 82 is deposited. In an embodiment shown in FIGS. 9 and 10, there follows a photo mask and etch to pattern the first electrode 81, a resist strip, and the photo mask and etch to pattern the intermediate layer 82 and another resist strip. Alternatively the layer 82 may be patterned followed by the first electrode patterning. Or the first electrode may be patterned, the first electrode patterned, and then the layer 82.

Figure 18:
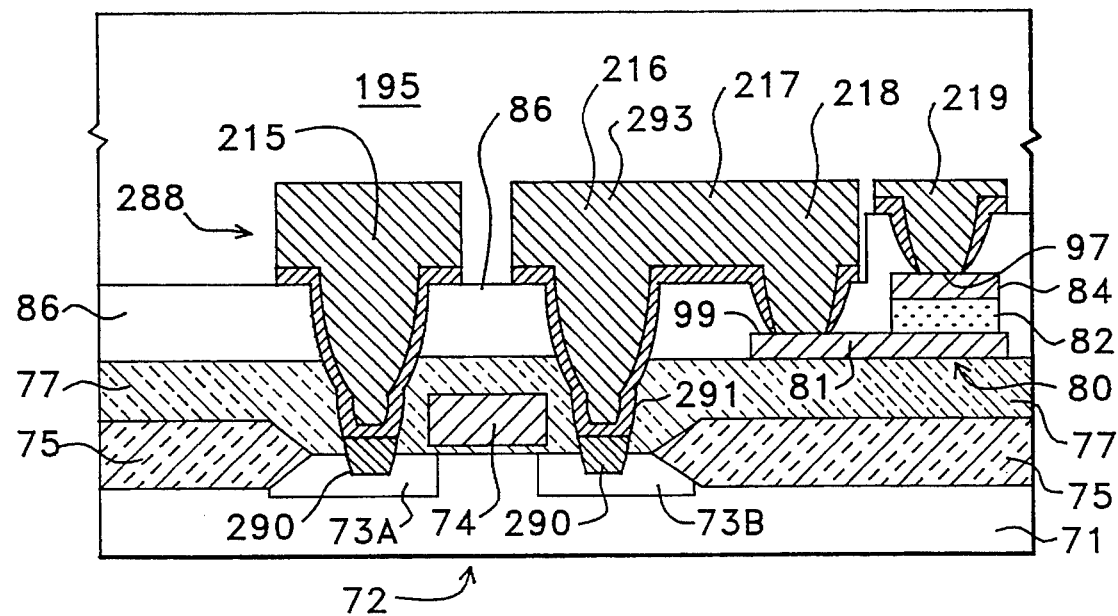
FIG. 18 shows a cross-sectional view of the wafer of FIG. 17 after the wiring layer has been patterned in the 3rd metal photo mask and etch, a resist strip, planarization of the wiring layer, and deposition of an insulating capping layer.
Figure 19:
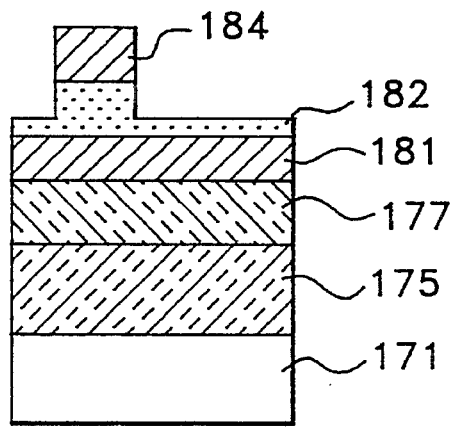
FIGS. 19 through 21 show an alternative embodiment of the process of patterning the capacitor.
Figure 20:
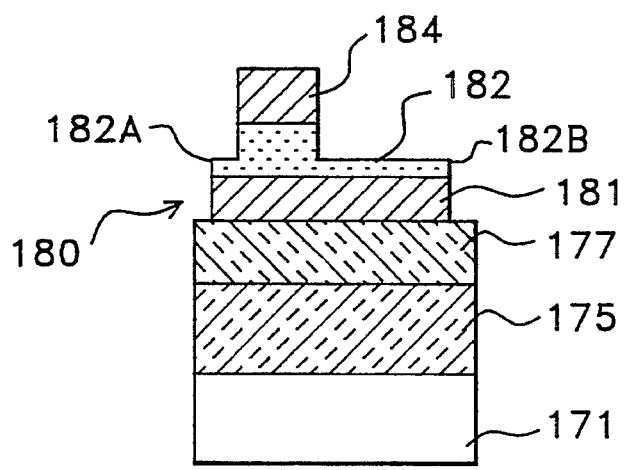
Figure 21:
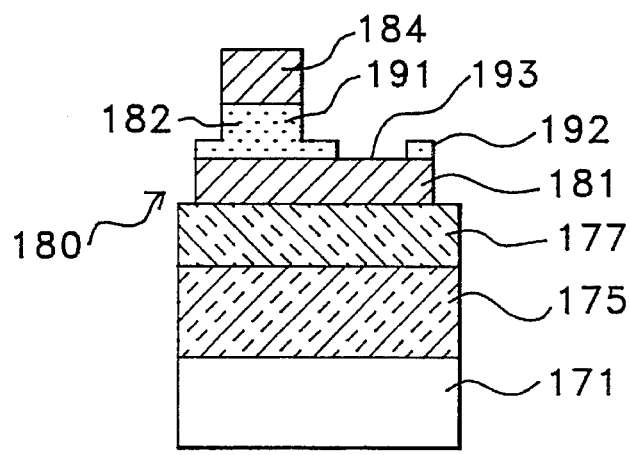

Another embodiment of the capacitor patterning is shown in FIGS. 19 through 21. In this process the second electrode 184 is patterned as shown in FIG. 19, the 2nd anneal is performed, the first electrode 181 and the ends 182A and 182B of the intermediate layer 182 are patterned, then a via 193 is formed in the layer 182 between the portion 191 of layer 182 and extension 192. In this embodiment the capacitor 180 is shown oriented with the extension 192 to the right of portion 191 as it would be if the CMOS transistor were on the right, illustrating that various arrangements of the transistor and capacitor are contemplated other that the orientation shown in FIGS. 3 through 18. In this embodiment the wiring layer contact to capacitor 180 is made through a contact hole that penetrates through the second insulating layer to the first electrode 181 at via 193. This embodiment with via 193 is generally preferred as the extension 192 of layer 182 assists in preventing short circuits between the electrodes 184 and 181. Again the patterning of the electrodes 184 and 181 and the layer 182 may be performed in various orders. In the preferred embodiment as shown in FIG. 1, the second electrode 184 is patterned, the via 193 is formed, and then the ends 182A and 182B of the intermediate layer 182 and the first electrode are patterned together. Again all patterning is performed by conventional resist deposition, photo mask and etch followed by ion milling and resist strip.

Figure 11:
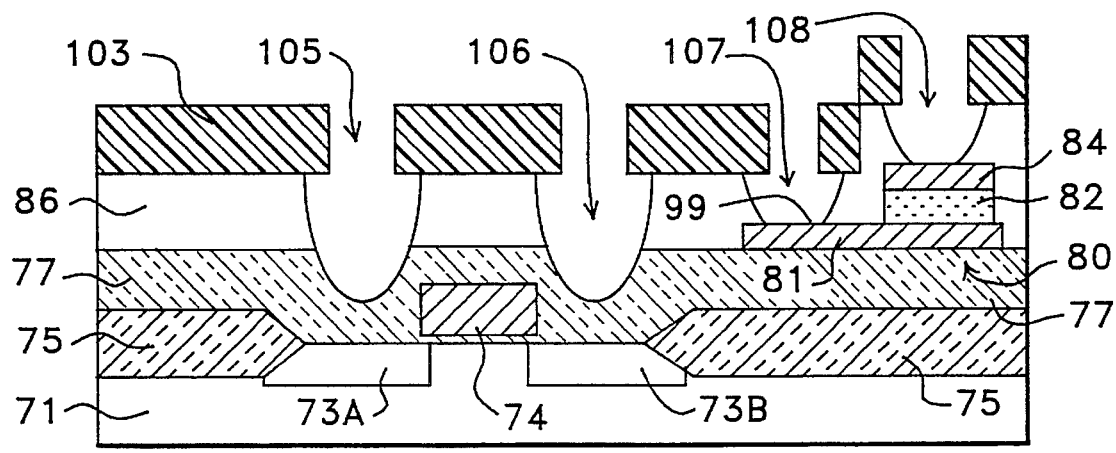
FIG. 11 shows a cross-sectional view of the wafer of FIG. 3 after the first SOG layer, the capacitor, and the second insulating layer have been formed, the first contact resist has been deposited, and the first contact photo and etch have been performed.

Turning to FIG. 11, the second insulating layer 86 is deposited after the capacitor 80 is patterned. Here the material used in forming an insulating layer between the capacitor and wiring layers in prior art ferroelectric and MOS processes, such as CVD phosphosilicate glass, tended to degrade the ferroelectric performance of the layered superlattice materials. SOG was again turned to because of the success with it in the 1st insulating layer, and it was found to produce excellent results. In this case however, the phosphosilicate glass, such as ACCUGLASS P114A™, available from Allied Chemical is preferred, although the silicate SOGs, such as the ACCUGLASS 111™, also works well. As mentioned above, the 111™ material includes methyl siloxane polymers with about 10% by weight —$CH_3$. The silicate SOG has excellent dielectric properties, density, low shrinkage upon cure, and good handling during the spin process. The phosphosilicate glass P114A™ comprises 5% by weight $P_2O_5$ doped silicate. Thus, the phosphosilicate glass spin-on process must be carefully designed to avoid ambient moisture, and the relative humidity during spin should be maintained at 40%±5%. However, if this can be done, then phosphosilicate is preferred because these films are more dense upon cures at higher than 425° C., and their dielectric properties also improve at the higher temperatures, while at the higher temperatures the siloxanes tend to lose the methyl groups which are replace by silanol groups, which produces little densification. At the annealing temperature of 800° C., the shrinkage of the P114A™ is nearly the same as the 111™. Further, the etch rates of the phosphosilicates are similar to the conventional CVD oxides, and they also provide approximately the same $Na^+$ getter capacity as the similarly P-doped conventional CVD oxide films. The siloxane films are susceptible to oxidation during resist strip of a via or contact mask by $O_2$ plasma etching. Such oxidation can convert the siloxane film into a porus, hygroscopic material leading to moisture outgassing which creates contamination problems. In addition, it has been found that the presence of dust on the substrate may trigger cracking of the 111™ films. The phosphosilicates do not have these problems. Under the conditions of depositing the 2nd insulating layer according to the process or the invention, it has been found that cracking of the phosphosilicates is less than that of the siloxanes.

The phosphosilicate glass is spin coated at 1500 RPM for 30 seconds for each coat, with three coats being preferred, to produce a thickness of about 3000 Å. The SOG is dried, cured, and baked in a multi-step anneal process including curing at 450° C. for 60 minutes in $N_2$, and hard baking at 800° C. for 30 minutes in $O_2$. It is particularly important that the hard bake be in oxygen, as at least some samples that were hard baked in nitrogen peeled. Again, as will be discussed in more detail below, the temperature is preferably ramped up and down in three or more steps in both the cure and hard bake processes.

Focusing again on FIG. 11, after the 2nd insulating layer 86 is formed, a layer 103 of resist is deposited and a conventional photo mask process is performed. The first contact hole etch with 1 HF (49%)+6$NH_4F$ (40%) for 3 minutes is then performed. This is a "soft" oxide etch which penetrates the SOG of the 2nd insulating layer and the SOG and BPSG layers of the 1st insulating layer, and stops on the platinum electrodes 81 and 84 and the APCVD NSG 77C (FIG. 4). The resist 103 is stripped, then a 3rd multi-step anneal is performed including a hard bake at 800° C. for 30 minutes in oxygen, with the temperature being ramped up and down in steps as will be discussed further below.

Figure 23:
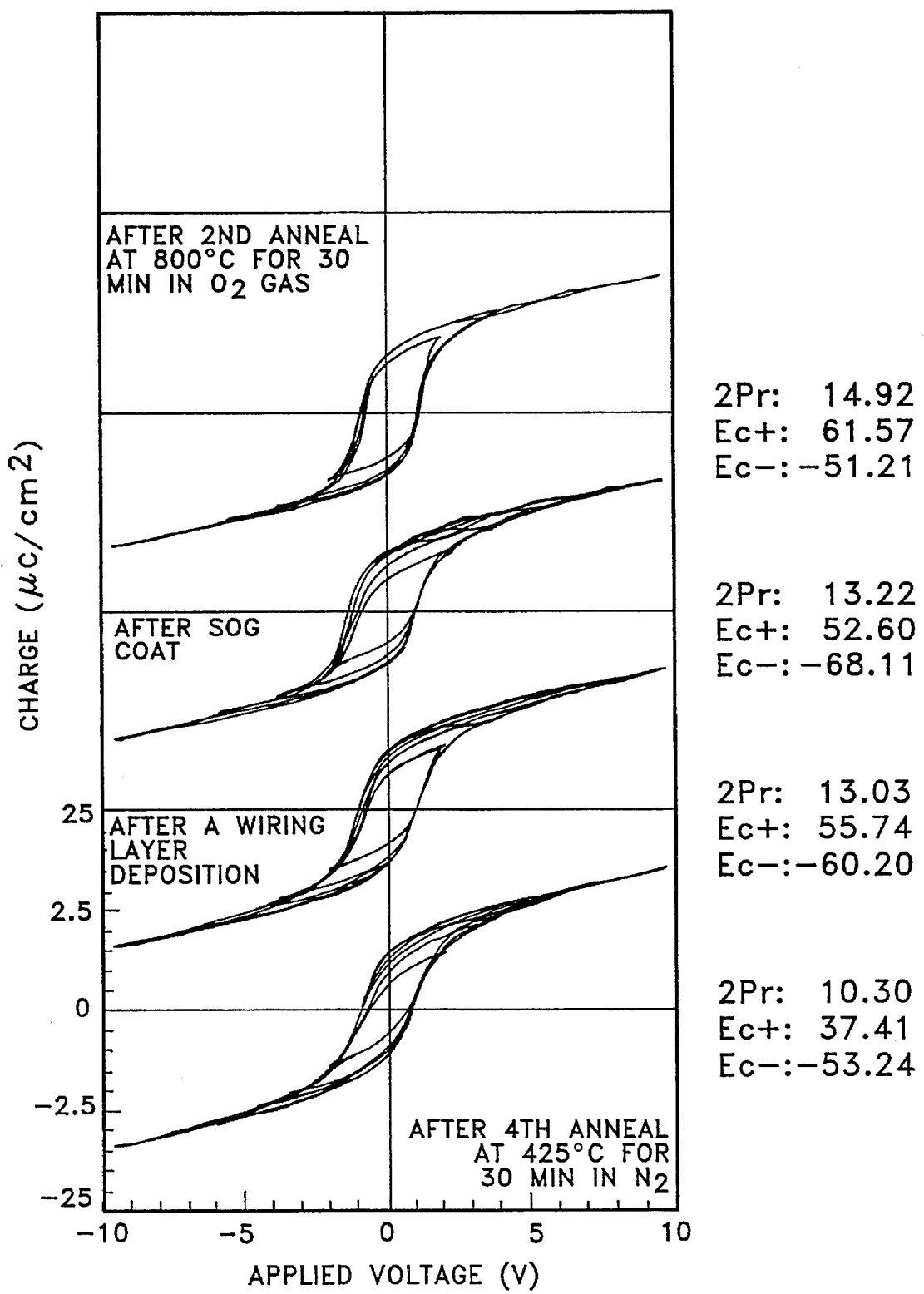
FIG. 23 shows hysteresis curves at 2, 4, 6, 8, and 10 volts for several different points in the fabrication process for a device that was made without the 3rd anneal process, and gives values of 2Pr, Ec+ and Ec− measured for the 10 volt hysteresis curve for each set of curves.
Figure 24:
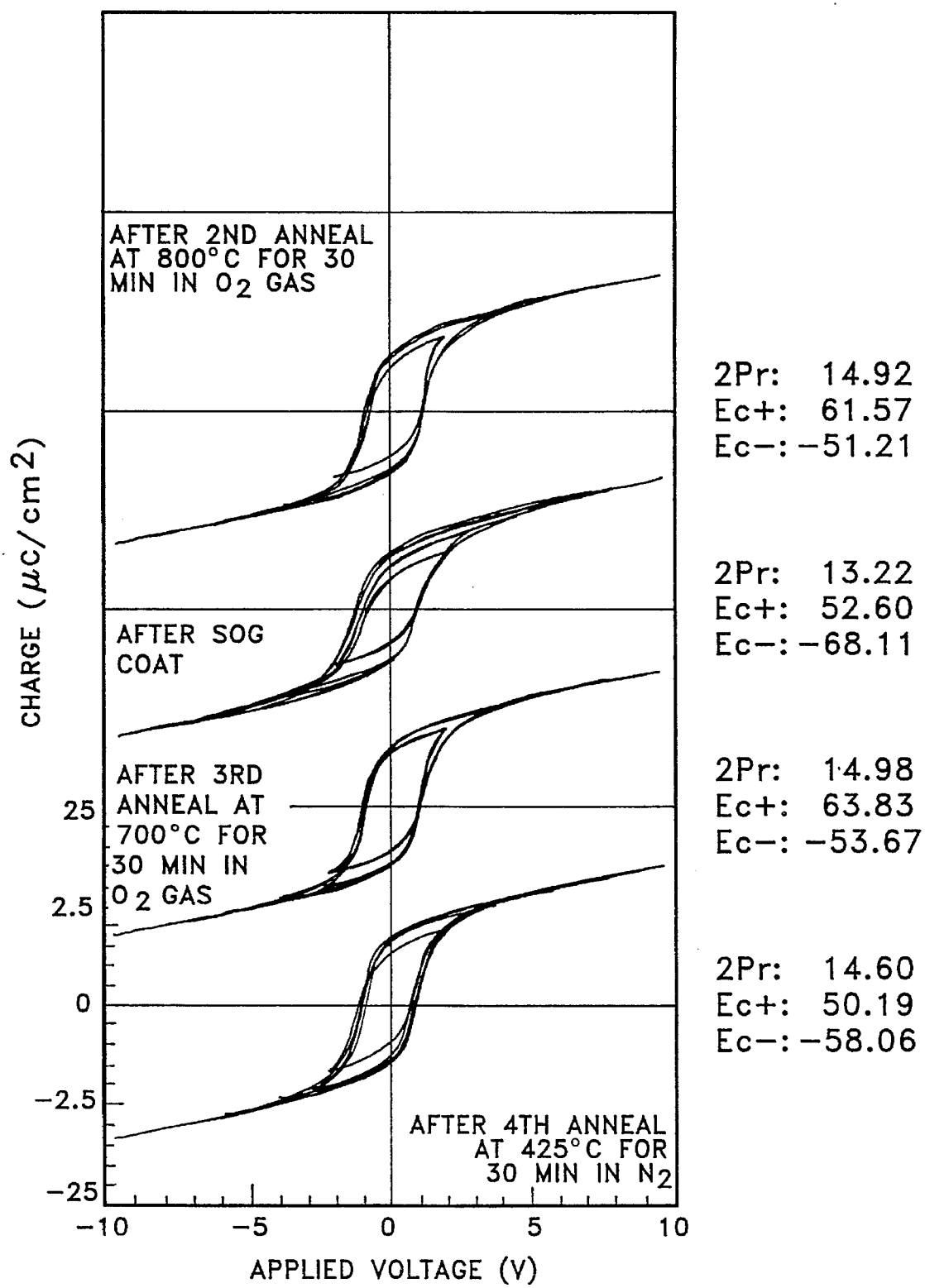
FIG. 24 shows hysteresis curves at 2, 4, 6, 8, and 10 volts for several different points in the fabrication process for a device that was made with the 3rd anneal process, and gives values of 2Pr, Ec+ and Ec− measured for the 10 volt hysteresis curve for each set of curves.

The 3rd anneal between the forming of the 2nd insulating layer may be combined with the hard bake step 57. That is, the hard bake step 57 may be skipped and the 3rd anneal step 61 takes its place. Or the 3rd anneal step 61 may be done at the same time as the hard bake step 57. In the preferred embodiment, however, both steps are performed, and the 3rd anneal is done between the two contact etches. Whatever the timing of this step, it is important that an anneal at a high temperature in the range 600° C. to 850° C. between the deposition of the 2nd insulating layer and the deposition of the wiring layer be performed. The anneal should preferably not be performed when the contact holes are completely open, i.e. after the second etch described below, in order to avoid problems with the MOS structures created in steps 1–35. The 3rd anneal may be done in nitrogen, oxygen, or a mixture of nitrogen and hydrogen, though preferably it is in oxygen. Again, as will be discussed below the temperature is preferably ramped up and done in three or more steps. FIG. 23 shows a series of four hysteresis curves measured at various points in a process that did not include the 3rd anneal, and FIG. 24 shows another series of four hysteresis curves measured at similar points in a process that included the 3rd anneal. Looking at FIG. 23, the value of 2PR drops steadily during the process, from 14.92 microcoulombs/$cm^2$ to 10.30 microcoulombs/$cm^2$ after the 4th anneal. Looking at FIG. 24, 2Pr again starts at 14.92 microcoulombs/$cm^2$ after the 2nd anneal, again drops to 13.22 microcoulombs/$cm^2$ after the SOG coat of the 2nd insulating layer 86, then increases to 14.88 microcoulombs/$cm^2$ after the 3rd anneal, and ends at 14.60 microcoulombs/$cm^2$ after the 4th anneal, 4.3 microcoulombs/cm² higher than the same process without the 3rd anneal.

Figure 12:
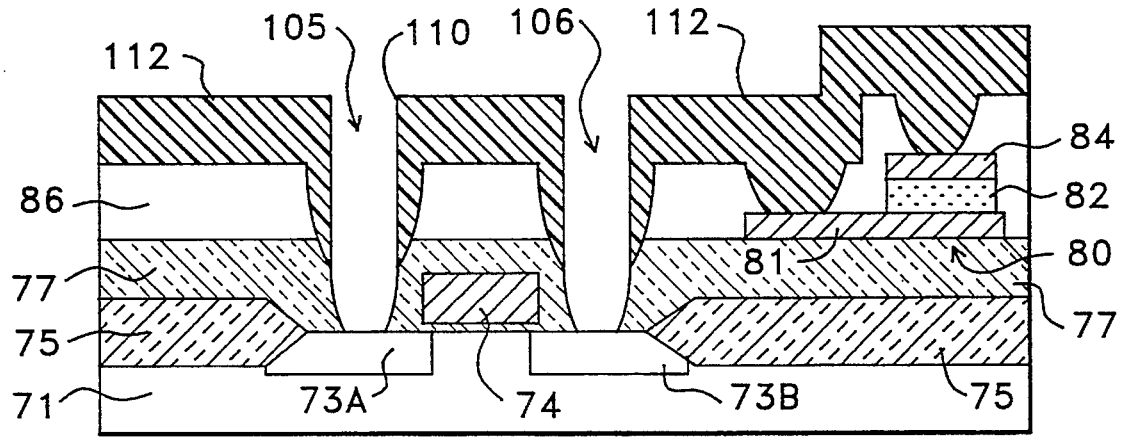
FIG. 12 shows a cross-sectional view of the wafer of FIG. 11 after the resist has been stripped, the wafer has been annealed, the second contact resist has been deposited, and the second contact photo and etch have been performed.
Figure 25:
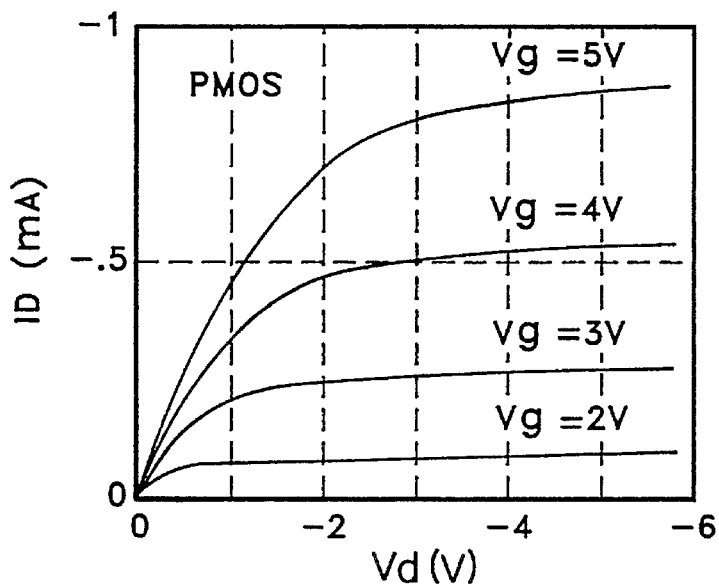
FIG. 25 shows drain voltage versus drain current for four different gate voltages for a PMOS integrated circuit device fabricated without the silicon etch process.
Figure 26:
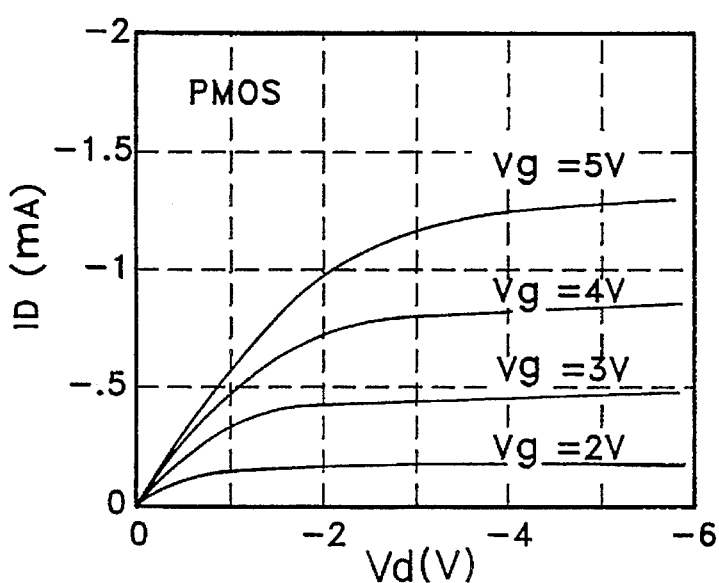
FIG. 26 shows drain voltage versus drain current for four different gate voltages for a PMOS integrated circuit device fabricated with the silicon etch process.

Turning now to FIG. 12, after the 3rd anneal step 61, another layer 112 of resist is deposited, and another contact photo mask step is performed. In the embodiment shown, the size of the contact holes in the mask, which can be gauged by the width of the holes such as 110 in the resist 112, is the same as the size of the holes in the mask used for the 1st contact etch in FIG. 11, however the mask only opens holes in the resist over contact holes 105 and 106. Alternatively, the size of the holes in the second contact mask may be smaller than those in the first mask. Following the opening of holes 110 in the resist, the contact holes 105 and 106 are opened down to the active areas 73A and 73B on the silicon substrate 71 with a 7 minute etch in 1 HF (49%)+6 $NH_4F$ (40%). This 2nd etch etches through the "hard" oxide layers 77C, 77B, and 77A (FIG. 4). In the preferred embodiment this second contact etch also includes a short, 20 second etch, which is a silicon etch, in 96 $HNO_3$(60%)+3 $CH_3COOH$(99.7%)+1 HF (49%)+100 $H_2O$. This etch is important for providing good electrical performance. FIG. 25 shows the drain current as a function of drain voltage for gate voltages of 2 volts, 3 volts, 4 volts and 5 volts for a device fabricated without the silicon etch step, and FIG. 26 shows the same curves for a device fabricated with the silicon etch step. The response of the current to the drain voltage is about 50% higher with the silicon etching.

It is possible to combine both the first and second etches above in a single contact etch, however, a single etch results in contact holes that taper outward at a much larger angle to the vertical. These leaves a severe process margin, with the possibility of short circuits developing between the wiring metal and the other conductive lines. Thus the multi-step etching process is much preferred.

After the 2nd contact etch, the resist 112 is stripped, and then a 3rd contact etch, which is a natural oxide etch, is preferably performed. This etch removes the natural oxide on the silicon just prior to deposition of the wiring layer. The etchant is preferably 1 HF (49%)+249 $H_2O$ and the etch time is preferably 2 minutes. This 3rd contact etch of the natural oxide is important for providing good electrical performance of the MOS devices.

Figure 13:
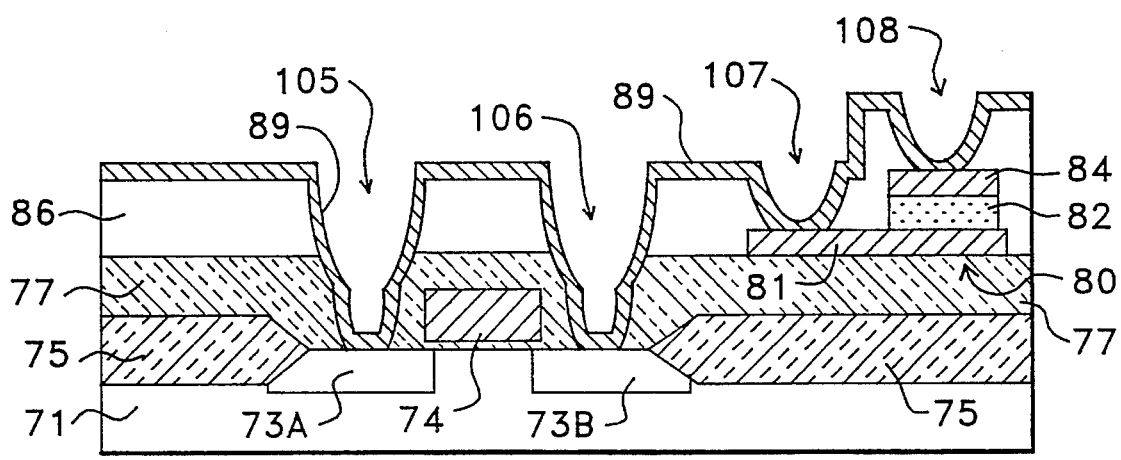
FIG. 13 shows a cross-sectional view of the wafer of FIG. 12 after the resist has been stripped and the 1st metal wiring layer has been deposited.

The metal wiring layer 88, referred to as the 3rd metallization layer because it is the third metal layer deposited in the process, is deposited after the natural oxide etching. This step 66 may be a single deposition of a metal such as platinum, but in the preferred embodiment, as shown best in FIG. 14, three separate metal layers are deposited: a first wiring layer 89 of platinum about 500 Å thick, a second wiring layer 91 of titanium about 500 Å thick, and a third wiring layer 93 of platinum about 4000 Å thick. Preferably the deposition is done by sputtering. As we shall see below, the titanium layer 91 acts as a barrier which controls the depth of a platinum silicide layer 90 (FIG. 15) which forms the ohmic contacts between the active areas 73A and 73B and the wiring layer 88. Turning to FIG. 13, in the preferred embodiment, the 3rd metallization process 66 comprises a first wiring layer deposition step in which an approximately 500 Å thick layer 89 of platinum is deposited. A MOS anneal step 66B, which will be discussed below, may follow. Then the second wiring layer 91, again approximately 500 Å thick, of titanium is deposited (FIG. 14), followed by the third wiring layer 93, which is preferably an approximately 4000 Å thick layer of platinum. Turning to FIG. 15, a 3rd metal resist layer is deposited, a conventional photomask and ion milling etch is done to pattern the contacts, and the resist is stripped. The resulting wiring layer 88 comprises three layers 90, 91, 93 with portions 115 and 116 overlaying active areas 73A and 73B respectively, portion 118 overlying surface 99 of first electrode 81, portion 119 overlying surface 97 of second electrode 84, and portion 117 connecting portions 116 and 118. Portions 115 and 116 penetrate second insulating layer 86 and first insulating layer 77 to contact active areas 73A and 73B respectively, portion 117 overlies second insulating layer 86, and portions 118 and 119 penetrate second insulating layer 86 to contact surface 99 of first electrode 81 and surface 97 of second electrode respectively. Portions 116 and 118 are electrically connected by portion 117 thereby electrically connecting active area 73B to surface 99 of first electrode 81. In other embodiments active area 73B may be connected to second electrode 84, since the capacitor 80 will operate with the electric field or voltages placed across it being in either direction.

Figure 16A:
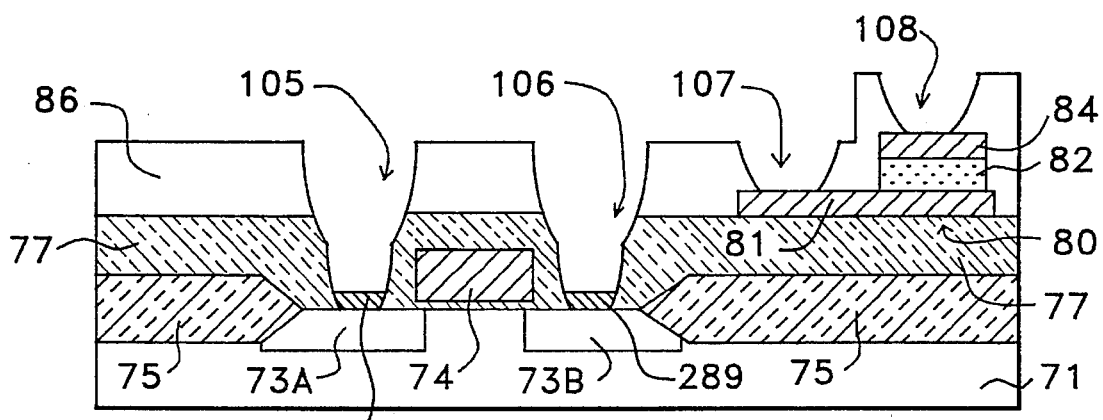
FIGS. 16A shows a cross-sectional view of the wafer of FIG. 13 in an alternative embodiment of the process and apparatus of the invention after the 1st wiring layer photo mask and etch process and a resist strip.
Figure 16B:
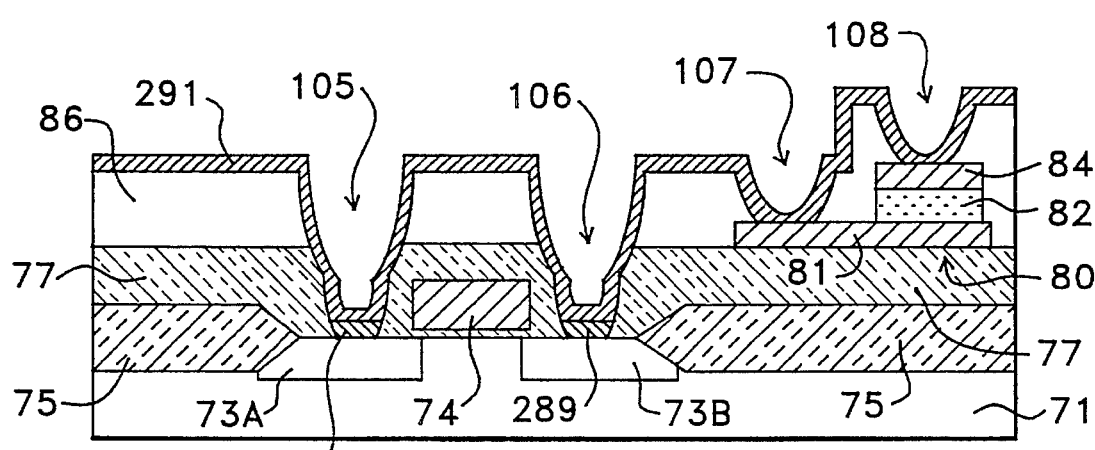
FIG. 16B shows a cross-sectional view of the wafer of FIG. 16A after the 2nd metal wiring layer has been deposited.
Figure 16C:
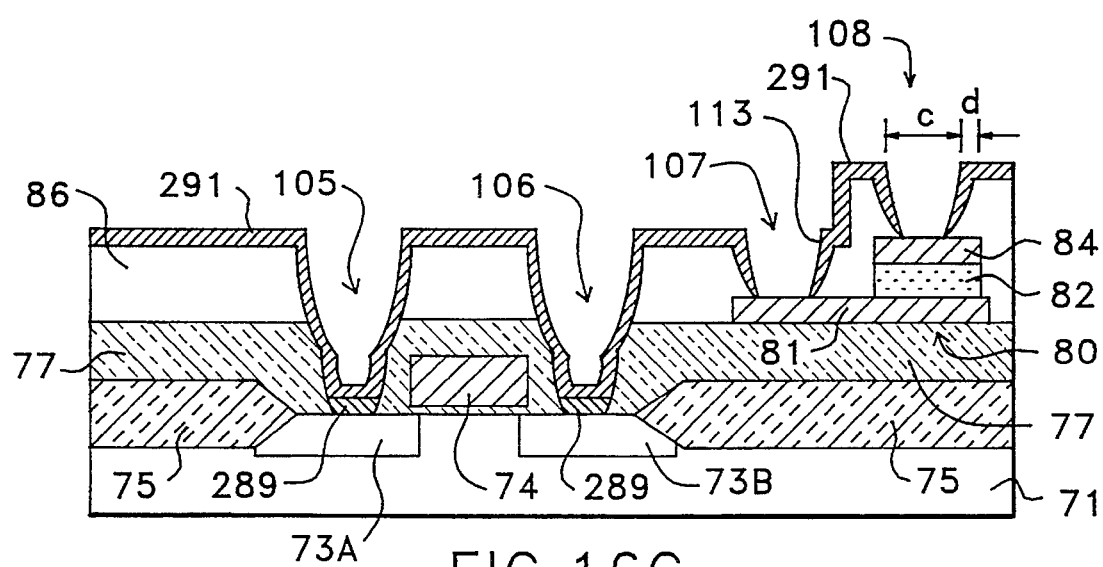
FIG. 16C shows a cross-sectional view of the wafer of FIG. 16B after the 2nd wiring layer photo mask and etch process and a resist strip.
Figure 17:
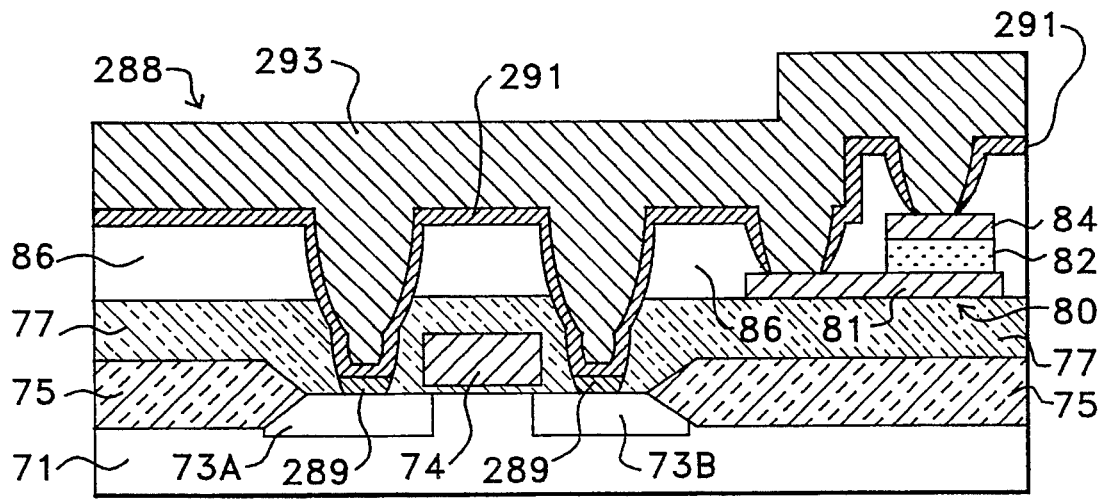
FIG. 17 shows a cross-sectional view of the wafer of FIG. 16C after the 2nd and 3rd wiring layers have been deposited.

Turning to FIGS. 2 and 16A through 18, an alternative embodiment of the invention is shown which strengthens the adhesive strength of the multilayered wiring layer 288 to the 2nd insulating layer 86. In this embodiment all steps and structures up to the formation of the 3rd metallization layer 288 are the same as in the embodiment described with reference to FIGS. 3 through 13, and thus the numerals referring to those structures have not been changed. The process of this alternative embodiment is shown in FIG. 2. As in the process described above, this process also begins with a first wiring layer deposition step 66A in which an approximately 500 Å thick layer 89 of platinum is deposited. This layer is shown as 89 in FIG. 13. An optional MOS anneal step 66B, mentioned above and which will be discussed below, follows and is shown in FIG. 2. In the alternative wiring layer process, there follows a 1st wiring layer photo mask step 66C using the same mask as the second contact etch with a negative resist, then a 1st wiring layer etch 66D, which leaves only a small portion 289 of the original first wiring layer 89 in the bottom of contact holes 105 and 106 (FIG. 16A). Then follows a resist strip 66E. Then the second wiring layer 291, again approximately 500 Å thick, of titanium is deposited (FIG. 16B). Then a 2nd wiring layer photo mask step follows (FIG. 16C), preferably using a mask with the same hole sizes as the first contact etch and a positive resist, but only reopening opening holes 107 and 108 over the capacitor 80. Then the 2nd wiring layer 291 is etched in step 66H, preferably by ion milling. Though the mask holes are the same size, the wet etch with which the holes were originally opened in step 59 overetches under the resist making a hole the radius of which is larger than the mask hole radius by the amount "d" (FIG. 16C), while the ion milling etch closely follows the pattern of the mask, as indicated by the diameter "c", resulting in a thin layer 113 of titanium which fills in the overetch area. This technique thus results in an intermediate layer 291 of titanium completely covering the area between the SOG layer 86 and the layer of platinum 293 (FIG. 17). The resist is stripped in step 66I, then the third wiring layer 293, approximately 4000 Å thick, of platinum is deposited (FIG. 17). Turning to FIG. 18, a 3rd metal resist layer is deposited, a conventional photomask and ion milling etch is done to pattern the contacts, and the resist is stripped. The resulting wiring layer 288 comprises three layers 290, 291,293 in portions 215, 216 overlaying active areas 73A and 73B, one layer 293 in portion 218 overlying surface 99 of first electrode 81, one layer 293 in a portion 219 overlying surface 97 of second electrode 84, and two layers 291,293 in a portion 217 connecting portions 216 and 218. Portions 215 and 216 penetrates second insulating layer 86 and first insulating layer 77 to contact active areas 73A and 73B respectively, portion 217 overlies second insulating layer 86, and portions 218 and 219 penetrate second insulating layer 86 to contact surface 99 of first electrode 81 and surface 97 of second electrode respectively. Portions 216 and 218 are electrically connected by portion 217 thereby electrically connecting active area 73B to surface 99 of first electrode 81. The fact that the layer of titanium 291 contacts the entire surface of the second insulating layer 86 over the entire region of contact between wiring layer 288 and second insulating layer 86 strengthens the adhesive bond between the wiring layer 288 and the second insulating layer 86.

Figure 27:
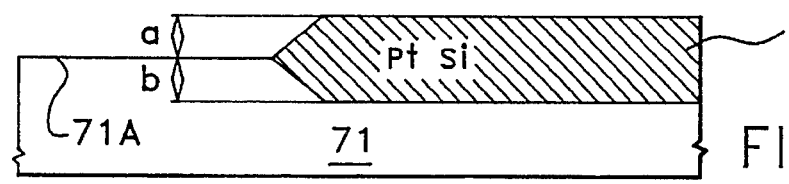
FIG. 27 is an illustration of a portion of the wafer of FIG. 18 defining the dimensions a and b.
Figure 28:
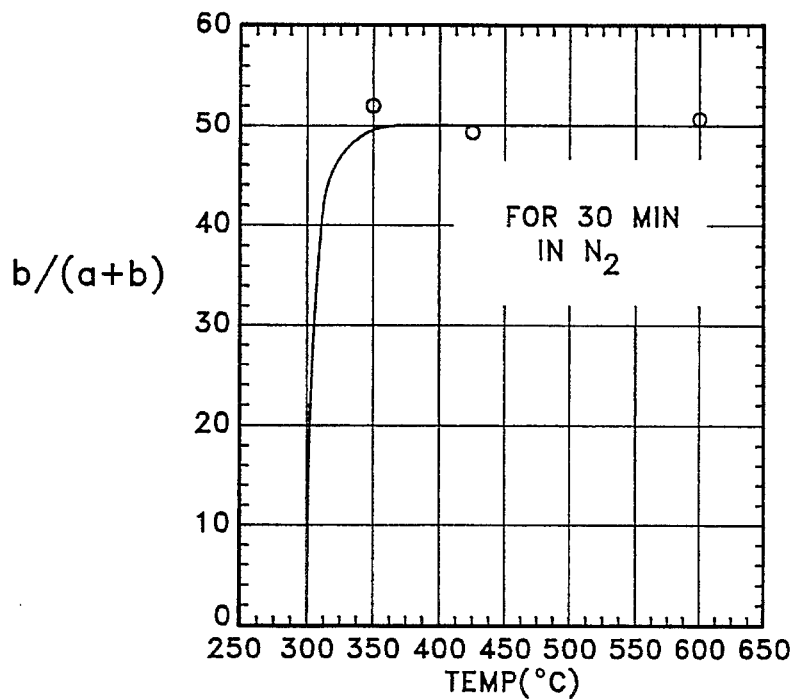
FIG. 28 is a graph of b/(a+b) versus anneal temperature illustrating how the thickness of the platinum silicide layer depends upon fourth anneal temperature.
Figure 29:
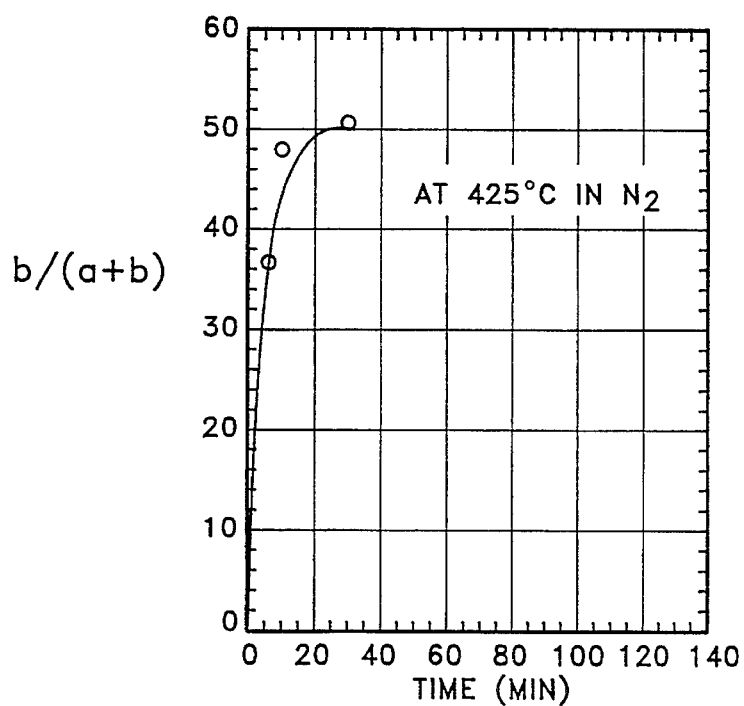
FIG. 29 is a graph of b/(a+b) versus anneal time illustrating how the thickness of the platinum silicide layer depends on fourth anneal time.
Figure 30:
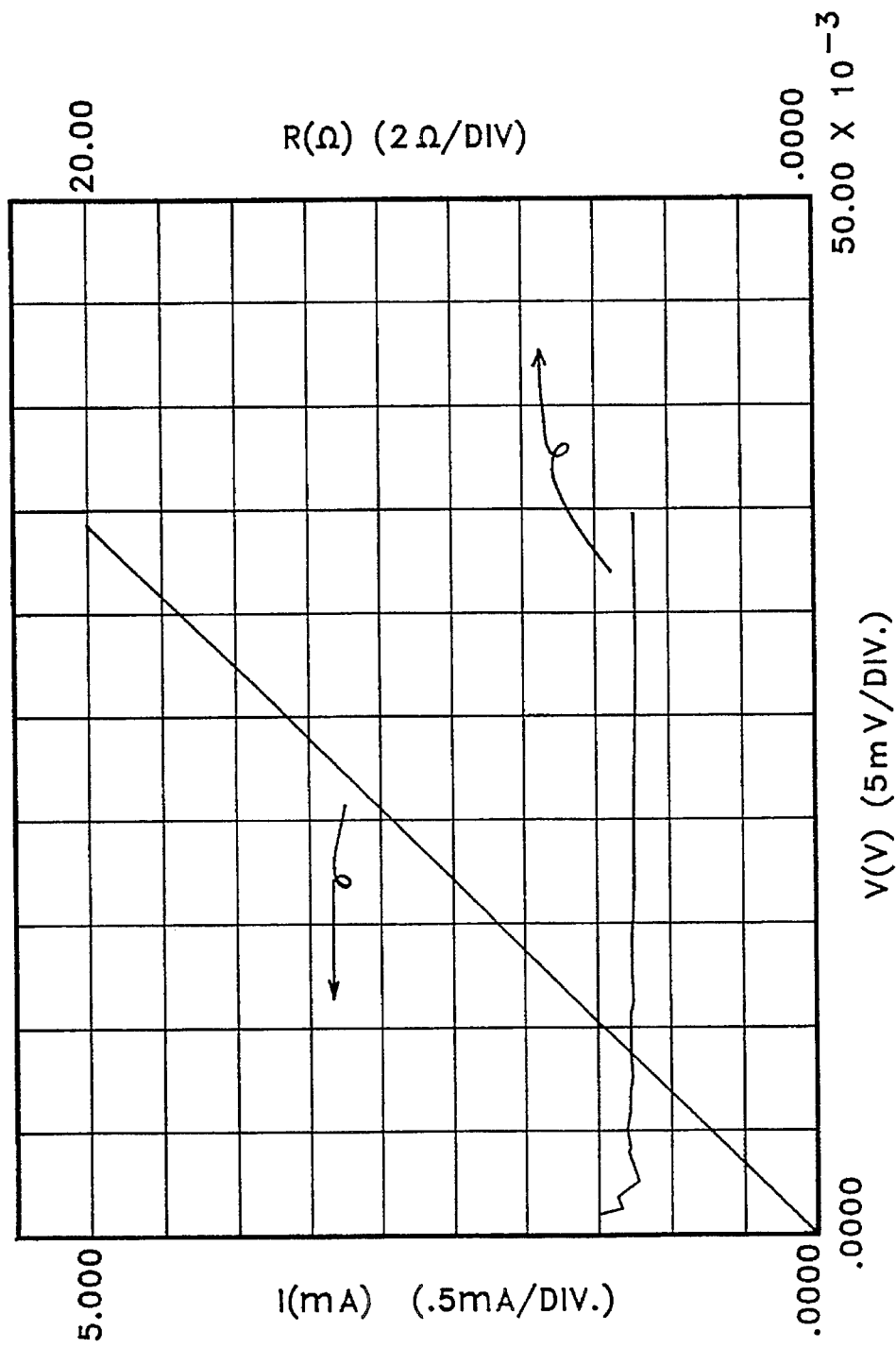
FIG. 30 is a graph showing how the current and the contact resistivity vary with applied voltage after the fourth anneal.

After completion of the wiring layer 88, 288, the final anneal is done. The final anneal is preferably done at 425° C. for 30 minutes in nitrogen. This anneal causes the first metal layer 89, 289 of platinum to combine with silicon where it contacts the substrate 71 to form platinum silicide. This platinum silicide layer 90, 290 creates an excellent ohmic contact. As can be seen in FIG. 30, the contact resistivity is flat, depending very little on voltage, and the current is a linear function of voltage. However, the depth of this platinum silicide layer 90, 290 must be carefully controlled taking into account the diffusion depth of the MOS transistors 72 to avoid degradation of the transistor electronic parameters. The dependence of the depth of the platinum silicide layer 90 on the 4th anneal temperature and time is shown in FIGS. 27 through 29. FIG. 27 defines the parameters "a" and "b", with "a" being the original thickness of the platinum layer 89, which, assuming there is no large volume change in the conversion of platinum to platinum silicide, is the distance silicide layer 90 extends above the surface 71A of silicon substrate 71 when the all the platinum 89 has changed to platinum silicide 90 and "b" being the distance the platinum silicide layer 90 extends below the surface 71A. As shown in FIG. 28, below 300° C. no platinum silicide forms; above 300° C. the thickness of the platinum silicide 90 grows rapidly with increase in temperature, then at about 350° C. b/(a+b) becomes constant, which means the platinum layer 89 has all been converted to platinum silicide, and thus the thickness of the of the platinum silicide layer 90 must be a constant also. The titanium layer 91 acts as a barrier metal to stop the growth of the platinum silicide layer. Turning to FIG. 29, at a constant temperature of 425° C., the thickness of the platinum silicide layer 90 grows with time, and becomes constant after about 10 minutes. Again, the titanium layer 91,291 acts as a barrier metal to stop the growth of the platinum silicide layer. It has been found that at a final anneal temperature of about 600° C. the metallic color of the wiring layer begins to fade, indicating degradation of the metal, and at an anneal temperature of 800° C. the platinum/titanium/platinum system bursts and titanium no longer acts as a barrier. From the above, the final or 4th anneal should be between 350° C. and 600° C.

Figure 31:
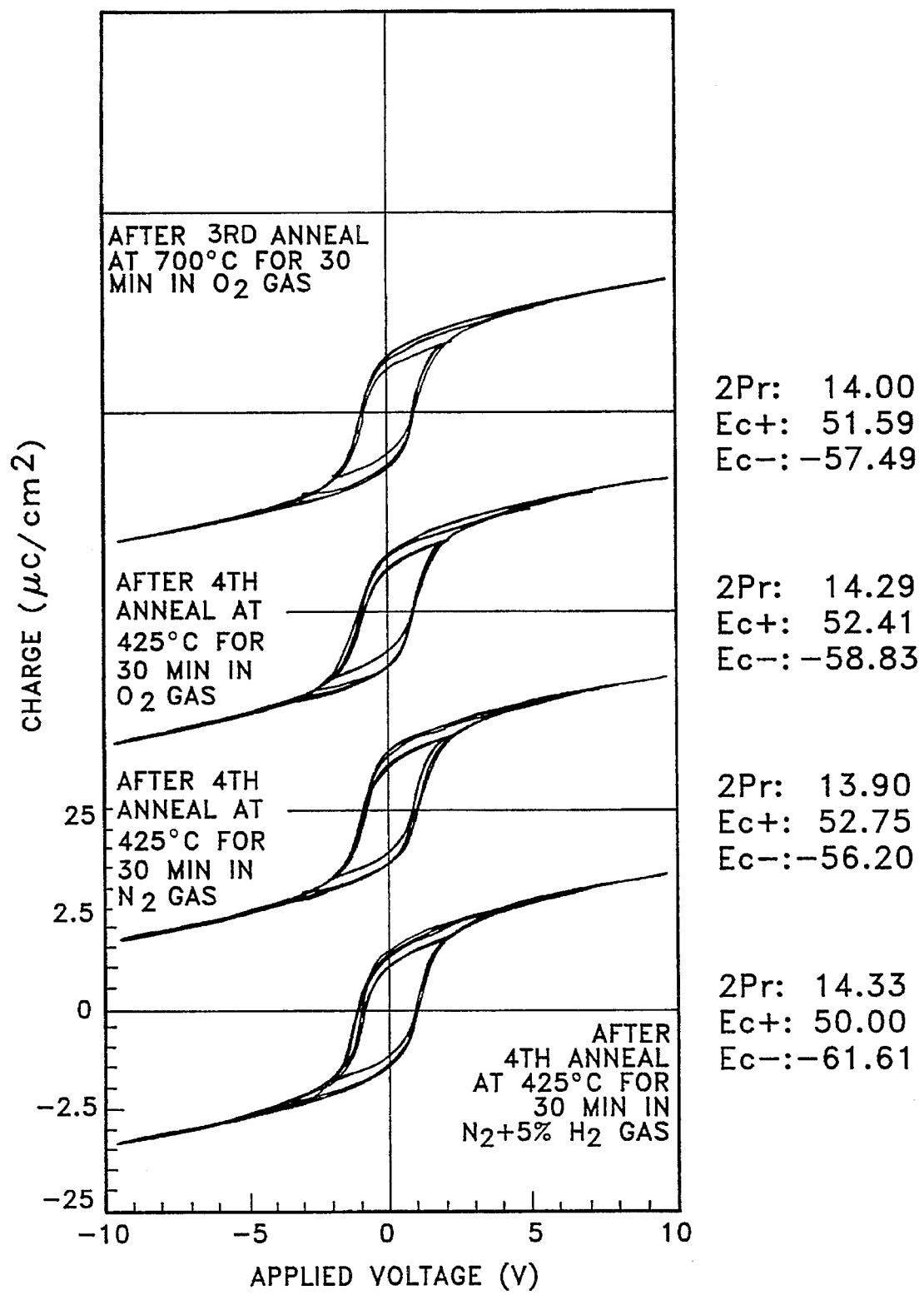
FIG. 31 shows hysteresis curves at 2, 4, 6, 8, and 10 volts for the 4th anneal process under different gaseous atmospheres, and gives the values of 2Pr, Ec+ and Ec− measured for the 10 volt hysteresis curve for each set of curves.

FIG. 31 shows hysteresis curves and values of 2PR, Ec+, and Ec− of a sample of strontium bismuth tantalate after the 3rd anneal, and then for three samples with the 4th anneal performed in different gases. The results vary a bit for the gases, with a mixture of 5% $H_2$ gas in nitrogen giving the best result and nitrogen the worst. However, the difference is not great.

Returning to FIGS. 15 and 18, after the fourth anneal, the wiring layer is planarized, and a capping layer 95 (FIG. 15), 195 (FIG. 18) preferably phosphorous-doped SOG, is deposited. The integrated circuit wafer may then be cut and packaged in conventional process steps to produce integrated circuit chips with conventional leads etc.

In the above discussion it has been mentioned several times that during the cures, hard bakes, and anneals the temperature is ramped up and down in steps. As the process for making layered superlattice device was developed from first a simple capacitor, to a coated capacitor, to a full MOS process, it was found that it became more necessary to use a multi-step ramped process. For example, referring to Table I, when a process was developed to build a coated capacitor, the SOG overlying the BPSG was first dried in a three step dry process: at temperatures of 100° C. for 2 minutes, then 160° C. for 2 minutes, then 250° C. for 2 minutes; the cure was skipped, and then there was a hard bake at 700° C. for 30 minutes in $O_2$. This was found to produce an SOG layer with no problems. A short, one-step anneal was then tried, hard baking at 800° C. for 30 minutes in $O_2$. This resulted in an SOG layer with bubbles and cracks. Thus the process was then "slowed down" to a cure at 425° C. for 60 minutes in $N_2$ followed by a hard bake at 800° C. for 30 minutes in $O_2$. This produced an SOG layer with no problems. However, when the same "anneal" process was tried with substrates with CMOS transistors, the resulting SOG had cracks. In the case of baking at 800° C. for 30 minutes in $N_2$, the result was still poor, with cracks and peeling. A process was then gone to, shown in the second from the bottom row in Table I, which included three dry steps, each one of increasing temperature, three cure steps, ramping up from 350° C. to 450° C. and then back down to 350° C., then six hard bake steps, ramping up from 450° C. to 600° C. to 800° C.

TABLE I

Development of "Multi-step anneal" Method
(Parameters for 1st Insulating layer SOG)

| COATED CAPACITOR ONLY (WITHOUT TRANSISTOR) | | | |
|---|---|---|---|
| DRY (HOT PLATE) | CURE (FURNACE) | HARD BAKE (FURNACE) | PROBLEM |
| 100° C., 2 min., 160° C., 2 min., 250° C., 2 min., | — | 700° C., 30 min., $O_2$ (Load in and out, 9 inches/minute) | — |
| — | — | 800° C., 30 min., $O_2$ | Bubbles, Cracks |
| — | 425° C., 60 min., $N_2$ | 800° C., 30 min., $O_2$ | — |

| FULL PROCESS | | | |
|---|---|---|---|
| DRY | CURE | HARD BAKE | PROBLEM |

TABLE I-continued

Development of "Multi-step anneal" Method
(Parameters for 1st Insulating layer SOG)

|  |  |  |  |
|---|---|---|---|
|  | 425° C., 60 min., N$_2$ | 800° C., 30 min., O$_2$ | Cracks (for BPSG) |
|  | 425° C., 60 min., N$_2$ | 800° C., 30 min., O$_2$<br>800° C., 30 min., N$_2$ | Cracks (for BPSG) Peeling |
| 100° C., 5 min.,<br>200° C., 5 min.,<br>300° C., 5 min., | 350° C., 15 min., 4N$_2$ + O$_2$<br>450° C., 60 min., 4N$_2$ + O$_2$<br>350° C., 15 min., 4N$_2$ + O$_2$ | 450° C., 15 min., O$_2$<br>600° C., 15 min., O$_2$<br>800° C., 30 min., O$_2$<br>600° C., 15 min., O$_2$<br>450° C., 15 min., O$_2$<br>300° C., 15 min., O$_2$ | — |
| 100° C., 5 min.,<br>200° C., 5 min.,<br>300° C., 5 min., | 350° C., 10 min., N$_2$<br>450° C., 60 min., N$_2$<br>350° C., 10 min., N$_2$ | 450° C., 10 min., O$_2$<br>600° C., 10 min., O$_2$<br>800° C., 30 min., O$_2$<br>600° C., 10 min., O$_2$<br>450° C., 10 min., O$_2$<br>300° C., 10 min., O$_2$ | — | in three steps and then down to 300° C. in three steps. This produced a good result, so the process was "speeded up" by decreasing the times in the ramping up and down steps from 15 minutes to 10 minutes in both the cure and hard bake. This still produced a good result. In actual practice, many more attempts an a good deal of analysis was involved, but much has been left out for the sake of brevity. Thus, whenever a multi-step anneal process was referred to above, a process such as shown in the last row of Table 1 was used.

Figure 32:
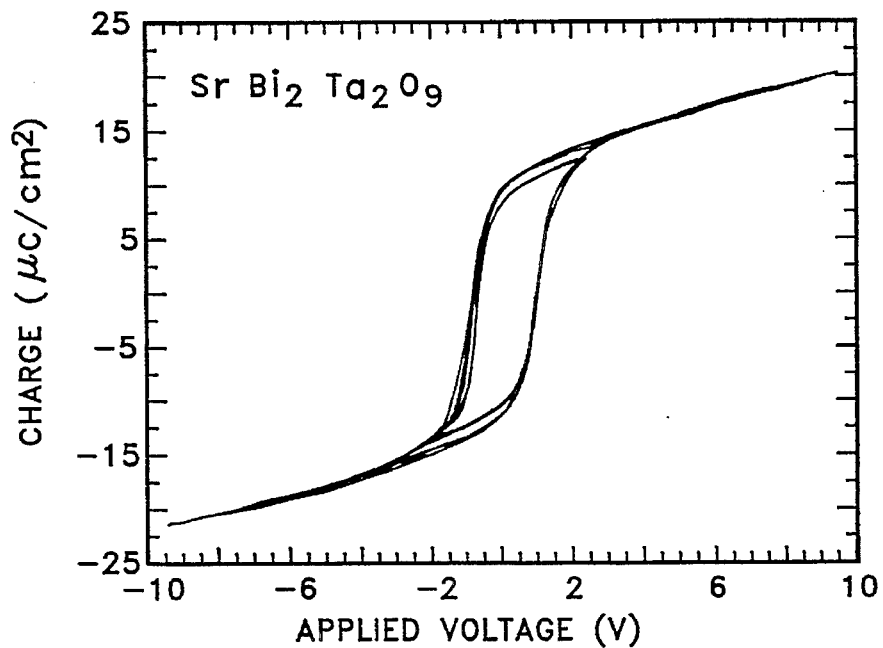
FIG. 32 shows hysteresis curves at 2, 4, 6, 8, and 10 volts for a ferroelectric capacitor made with strontium bismuth tantalate with 10% excess bismuth in the precursor solutions after the full process according to the invention.
Figure 33:
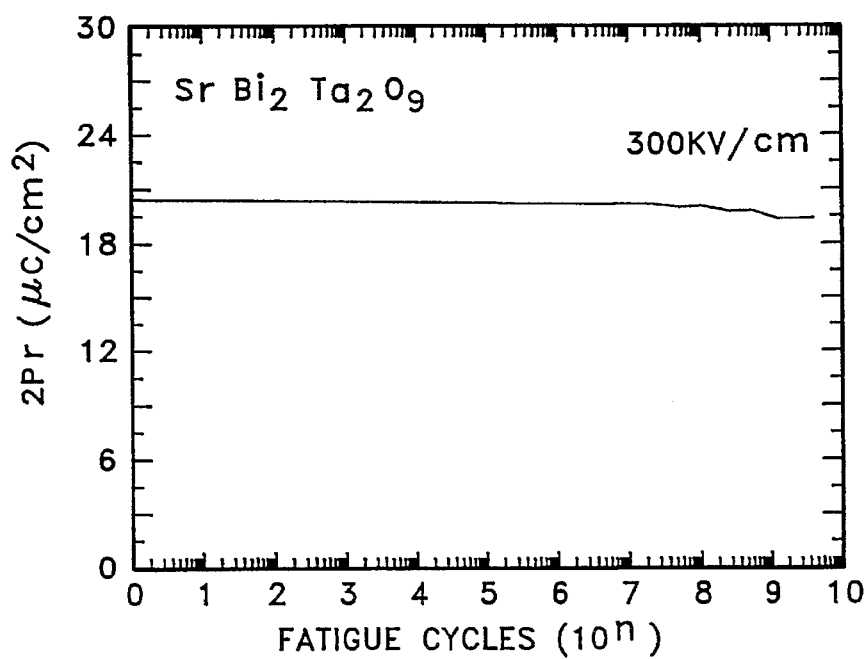
FIG. 33 shows a graph of 2Pr versus number of switching cycles for the device of FIG. 32 illustrating the low fatigue and high polarizability of the device.

The process according to the invention just described produces ferroelectric and layered superlattice devices that have excellent CMOS characteristics as discussed above in relation to FIGS. 25, 26 and 30. FIGS. 32 and 33 show typical ferroelectric performance of a device manufactured according to the invention utilizing strontium bismuth tantalate (SrBi$_2$Ta$_2$O$_9$), a ferroelectric layered superlattice material, in intermediate layer 82, with 10% excess bismuth in the precursor solution. FIG. 32 shows hysteresis curves measured at 2 volts, 4 volts, 6 volts, 8 volts and 10 volts, superimposed. As shown the hysteresis curves nearly lie on top of one another, indicating consistent performance over a wide range of voltages. The curve is also very vertical and boxy, indicating excellent potential as a memory and other applications. FIG. 33 shows a plot of 2Pr versus number of cycles for the sample of FIG. 32 when a switching field of 300 KV/cm was applied. This is often referred to as a material endurance or "fatigue" curve. In prior art ferroelectric devices the polarizability decayed 50% of more over, say, a hundred million switching cycles, and this has become known as material fatigue. A cycle is defined as a capacitor, such as 80, being switched through one square pulse. The curve of FIG. 33 shows almost no fatigue out to nearly $10^{10}$ cycles.

Figure 34:
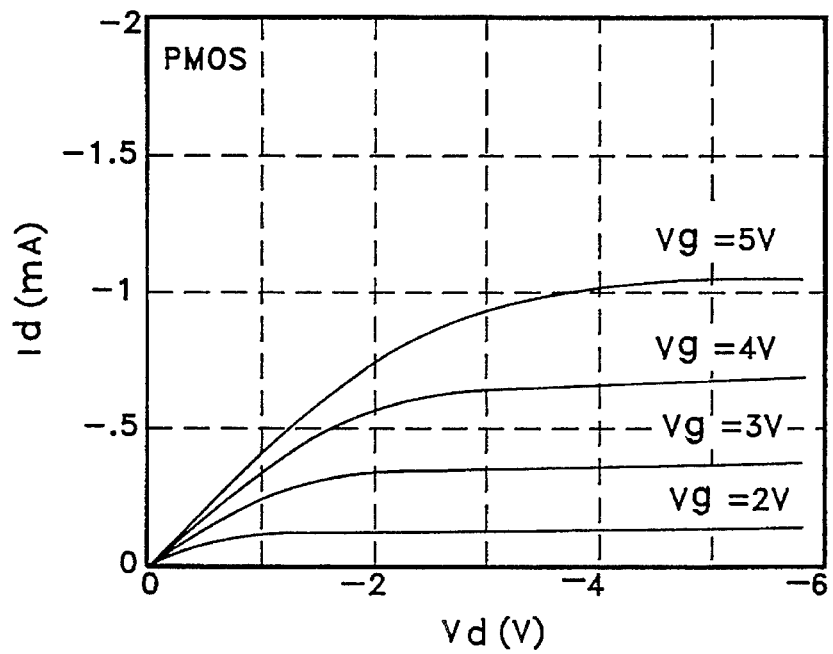
FIG. 34 shows drain voltage versus drain current for four different gate voltages for a PMOS integrated circuit device fabricated according to the process of the invention incorporating a MOS anneal between the deposition of the 1st and 2nd wiring layers in the 3rd metal deposition process.
Figure 35:
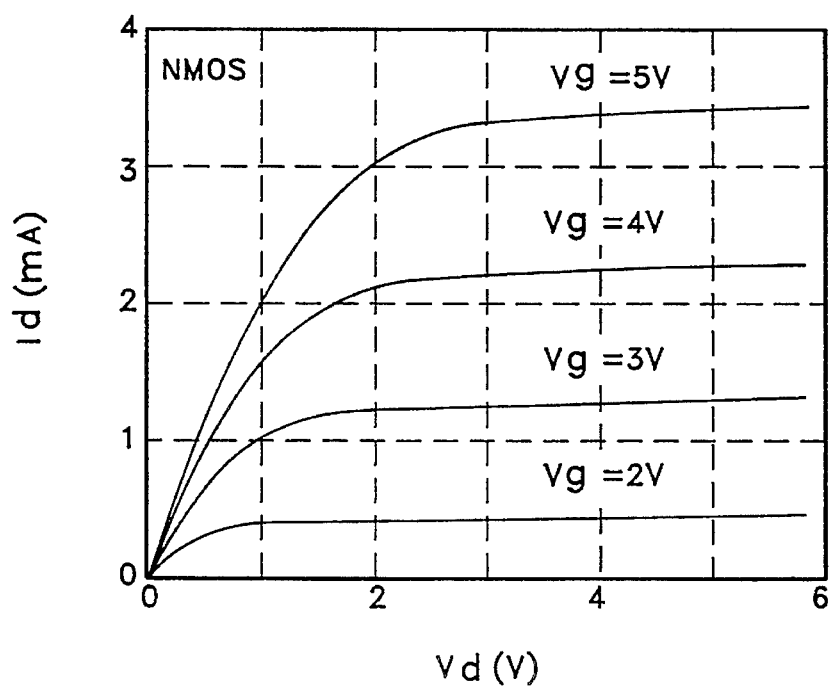
FIG. 35 shows drain voltage versus drain current for four different gate voltages for an NMOS integrated circuit device fabricated according to the process of the invention incorporating a MOS anneal between the deposition of the 1st and 2nd wiring layers in the 3rd metal deposition process.
Figure 36:
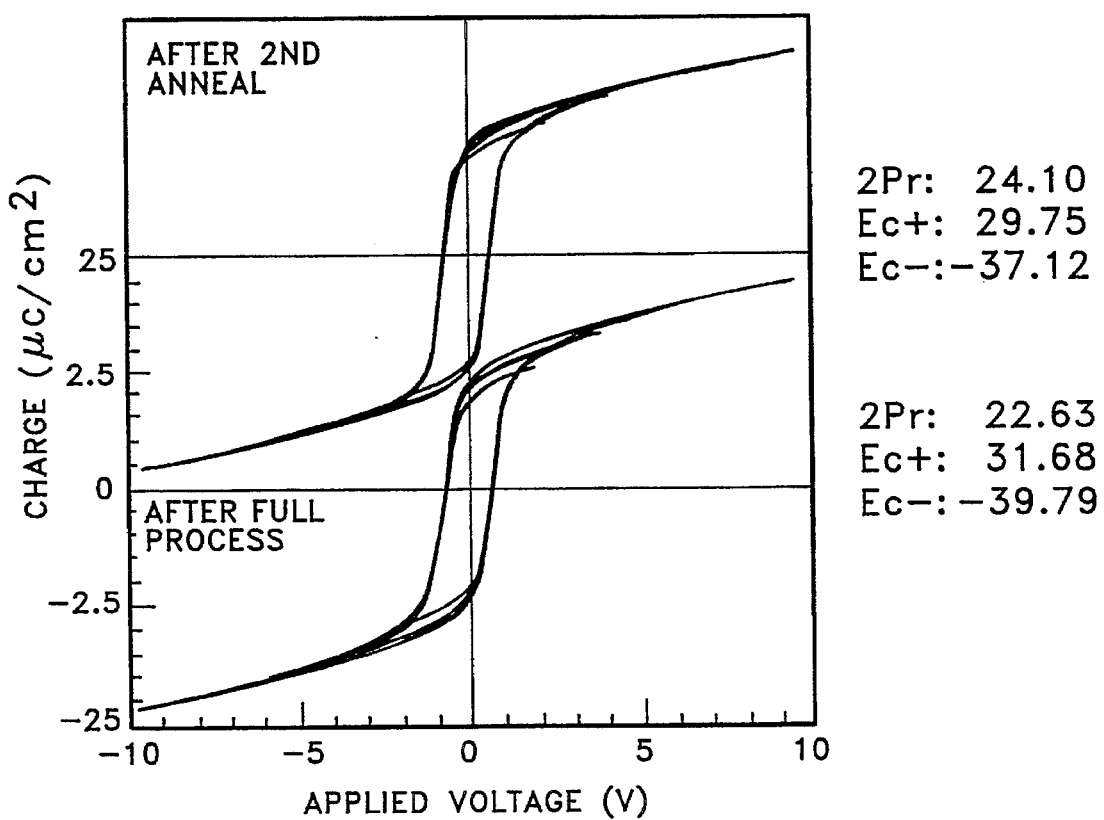
FIG. 36 shows hysteresis curves at 2, 4, 6, 8, and 10 volts for a ferroelectric capacitor made with strontium bismuth tantalate with 10% excess bismuth in the precursor solutions after the 2nd anneal and after the full process according to the invention incorporating a MOS anneal between the deposition of the 1st and 2nd wiring layers in the 3rd metal deposition process.

In a variation of the above process, an addition anneal step 66B may be added in step 66, the 3rd metal (wiring layer 88) deposition process. As discussed above, the step 66 is preferably a process in which three different layers of metals are deposited. In the variation, after the deposition of the first layer of platinum, the wafer is annealed at 450° C. for 120 minutes in N$_2$ +5% H$_2$. This additional anneal is at the preferred temperature discussed above for creating the platinum silicide layer 90, which temperature is not so high as to cause problems with the CMOS components. Moreover, the presence of a small amount of H$_2$ substantially returns the MOS devices 72 to the initial characteristics they had prior to the layered superlattice capacitor formation processes. As shown in FIGS. 34 and 35, both the PMOS and NMOS devices show good characteristics. The drain current versus the drain voltage for the same device at 4 different gate voltages is shown in FIG. 30. For a 5 volt gate voltage, the drain current is a milliamp at saturation and rises linearly prior to saturation, and similarly excellent at lower gate voltages. FIG. 35 shows the same curves for an NMOS device. These results are even better, with the drain current for a gate at 5 volts being over 3 milliamps. Hysteresis curves for a strontium bismuth tantalate (SrBi$_2$Ta$_2$O$_9$)device with 10% excess bismuth in the precursor fabricated according to the variation of the process having an anneal step 66B after the first metallization layer is deposited are shown in FIG. 36. The hysteresis curve measured after the second anneal has a 2Pr of 24.10 microcoulombs/cm$^2$. Even after the full process, 2Pr is 22.63 microcoulombs/cm$^2$. The fatigue results were correspondingly good. Thus the ferroelectric performance of the layered superlattice devices after the full CMOS process is also good.

As an example of an actual process, the complete process by which the samples having the results shown in FIGS. 34 through 36 is described in Table II.

TABLE II

| CMOS process | | | | |
|---|---|---|---|---|
| SOG | coat | 1 layer | 3000 rpm 30 sec | |
|  | softbake |  | 100° C. 5 min | on hot plate |
|  |  |  | 200° C. 5 min | on hot plate |
|  |  |  | 300° C. 5 min | on hot plate |
|  | cure |  | 350° C. 10 min | in N$_2$ gas |
|  |  |  | 450° C. 60 min | in N$_2$ gas |
|  |  |  | 350° C. 10 min | in N$_2$ gas |
|  | hard bake |  | 450° C. 10 min | in O$_2$ gas |
|  |  |  | 600° C. 10 min | in O$_2$ gas |
|  |  |  | 800° C. 60 min | in O$_2$ gas |
|  |  |  | 600° C. 10 min | in O$_2$ gas |
|  |  |  | 450° C. 10 min | in O$_2$ gas |
| Bottom electrode depo | | Pt 2000Å | | |
| Anneal |  |  | 800° C. 30 min | in O$_2$ gas |
| SrBi$_2$Ta$_2$ | 1st layer | coat | 1500 rpm 30 sec | |
|  |  | dry | 150° C. 5 min | on hot plate |
|  |  |  | 250° C. 5 min | on hot plate |
|  |  | RTP bake | 725° C. 30 sec in RTP | |
|  | 2nd layer | coat | 1500 rpm 30 sec | |
|  |  | dry | 150° C. 5 min | on hot plate |
|  |  |  | 250° C. 5 min | on hot plate |
|  |  | RTP bake | 725° C. 30 sec in RTP | |
| 1st anneal |  |  | 800° C. 60 min | in O$_2$ gas |

TABLE II-continued

| | | | |
|---|---|---|---|
| Top electrode depo | Pt | 2000Å | |
| Top electrode photo | resist coat, expose, develop | | |
| | etch | 14 min by Ion Milling | |
| | resist remove | 30 min by $O_2$ asher | |
| 2nd anneal | | 800° C. 30 min | in $O_2$ gas |
| Intermediate layer photo | resist coat, expose, develop | | |
| | etch | 8 min by Ion Milling | |
| | resist remove | 30 min by $O_2$ asher | |
| Bottom electrode photo | resist coat, expose, develop | | |
| | etch | 21 min by Ion Milling | |
| | resist remove | 30 min by $O_2$ asher | |
| SOG 1 layer | coat | 3000 rpm 30 sec | |
| | softbake | 100° C. 5 min | on hot plate |
| | | 200° C. 5 min | on hot plate |
| | | 300° C. 5 min | on hot plate |
| 2 layer | coat | 3000 rpm 30 sec | |
| | softbake | 100° C. 5 min | on hot plate |
| | | 200° C. 5 min | on hot plate |
| | | 300° C. 5 min | on hot plate |
| 3 layer | coat | 3000 rpm 30 sec | |
| | softbake | 100° C. 5 min | on hot plate |
| | | 200° C. 5 min | on hot plate |
| | | 300° C. 5 min | on hot plate |
| | cure | 350° C. 10 min | in $N_2$ gas |
| | | 450° C. 60 min | in $N_2$ gas |
| | | 350° C. 10 min | in $N_2$ gas |
| | hard bake | 450° C. 10 min | in $O_2$ gas |
| | | 600° C. 10 min | in $O_2$ gas |
| | | 800° C. 60 min | in $O_2$ gas |
| | | 600° C. 10 min | in $O_2$ gas |
| | | 450° C. 10 min | in $O_2$ gas |
| 1CON photo | resist coat, expose, develop | | |
| | etch | 3 min in 1HF(49%) + 6NH$_4$F(40%) | |
| | resist remove | 30 min | |
| 3rd anneal | | 450° C. 10 min | in $O_2$ gas |
| | | 600° C. 10 min | in $O_2$ gas |
| | | 800° C. 60 min | in $O_2$ gas |
| | | 600° C. 10 min | in $O_2$ gas |
| | | 450° C. 10 min | in $O_2$ gas |
| 2CON photo | resist coat, expose, develop | | |
| | etch | 7 min in 1HF(49%) + 6NH$_4$F(40%) | |
| | resist remove | 30 min | |
| | etch | 2 min in 1HF(49%) + 249(H$_2$O) | |
| 1st Wiring Layer | Metal depo | Pt 500Å | |
| Anneal | | 450° C. 120 min | in $N_2$ + 5%H$_2$ gas |
| 2 Wiring Layer | Metal depo | Ti 500Å | |
| 3 Wiring Layer | Metal depo | Pt 4000Å | |
| Wiring layer photo | resist coat, expose, develop | | |
| | etch | 30 min by Ion Milling | |
| | resist remove | 30 min | |
| Final anneal | | 400° C. 30 min | in $N_2$ gas |

There has been described a novel, integrated circuit fabrication process and structure which can be utilized to build ferroelectric memories, or high dielectric constant DRAMS utilizing layered superlattice materials, and which has many other advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that it is seen to be possible to integrate a ferroelectric or layered superlattice material into a CMOS device, the same novel concepts can be applied to fabricating bipolar or other integrated circuits. It is also evident that the steps recited may in some instances be performed in a different order. Or equivalent structures and process may be substituted for the various structures and processes described. Or a variety of different dimensions and materials may be used. Additional structures and process steps may be added. Consequently, the invention is to be construed as embracing each and every novel feature and novel combination of features present in and/or possessed by the integrated circuit structures and fabrication processes described.

What is claimed is:

1. A method of fabricating an integrated circuit, said method comprising the steps of:

providing a substrate comprising silicon;

forming a first electrode on said substrate;

annealing said first electrode;

forming an intermediate layer on said first electrode before patterning of said first electrode, said intermediate layer comprising a material selected from a group consisting of ferroelectric materials and layered superlattice materials;

annealing said intermediate layer;

forming a second electrode on said intermediate layer; then, subsequent to the above steps, patterning said first electrode, said intermediate layer, and said second electrode.

2. A method of fabricating an integrated circuit as in claim 1 wherein said step of forming said first electrode comprises depositing a layer of platinum, and said step of annealing said first electrode comprises heating to a temperature of between 750° C. and 850° C. for a period of between 15 minutes and one hour subsequent to said step of depositing said platinum.

3. A method of fabricating an integrated circuit as in claim 2 wherein said step of forming said first electrode comprises depositing a layer of titanium prior to depositing said layer of platinum, and said step of annealing said first electrode further comprises annealing said layer of titanium prior to said step of depositing said layer of platinum.

4. A method of fabricating an integrated circuit as in claim 1 wherein said step of patterning comprises etching said second electrode, then etching said first electrode, then etching said intermediate layer.

5. A method of fabricating an integrated circuit as in claim 1 wherein said step of patterning comprises etching said first electrode, etching said second electrode, then etching said intermediate layer.

6. A method of fabricating an integrated circuit as in claim 1 wherein said step of patterning comprises etching said second electrode, etching said intermediate layer, then etching said first electrode.

7. A method of fabricating an integrated circuit, said method comprising the steps of:

providing a substrate;

forming a capacitor on said substrate, said capacitor including an intermediate layer comprising a material selected from a group consisting of ferroelectric materials and layered superlattice materials;

spin coating a layer of insulator over said capacitor;

treating said insulator in three or more heating steps to form a solid insulating layer over said capacitor, the temperature of each heating step being at a higher temperature than the previous heating step.

8. A method as in claim 7 wherein said insulator is SOG.

9. A method as in claim 7 wherein said intermediate layer comprises a ferroelectric layered superlattice material.

10. A method as in claim 7 wherein said step of treating said insulator comprises drying said insulator in a series of two or more drying steps.

11. A method as in claim 10 wherein said step of treating said insulator further comprises, subsequent to said drying steps, curing said insulator in a series of three or more curing steps, the temperature being ramped up and down in said series of three or more curing steps.

12. A method as in claim 11 wherein said step of treating said insulator further comprises, subsequent to said curing steps, baking said insulator in a series of three or more baking steps, the temperature being ramped up and down in said series of three or more baking steps.

13. A method as in claim 12 wherein the lowest temperature of said baking steps is equal to the highest temperature of said curing steps.

14. A method as in claim 13 wherein each of said drying steps is at a temperature between 75° C. and 325° C., each of said curing steps is at a temperature of between 325° C. and 475° C., and each of said baking steps is at a temperature of between 400° C. and 825° C.

15. A method of fabricating an integrated circuit, said method comprising the steps of:

providing a substrate;

forming a transistor on said substrate, said transistor including an active area;

forming a first insulating layer overlying said transistor;

forming a capacitor on said first insulating layer without first providing a contact hole through said first insulating layer to said active area, said capacitor including a first electrode, an intermediate layer overlying said first electrode and comprising a material selected from a group consisting of ferroelectric materials and layered superlattice materials, and a second electrode overlying said intermediate layer;

forming a second insulating layer overlying said capacitor; thereafter performing a first etch through a first mask pattern to form a contact hole to at least one of said first electrode and said second electrode;

performing a second etch through a second etch pattern to form a contact hole to said active area; and forming a wiring layer contacting said active area and one of either said first electrode or said second electrode.

16. A method as in claim 15 wherein said first etch etches completely down to said one at least one of said first and second electrodes and partially down to said active area, and said second etch etches down to said active area.

17. A method as in claim 15 and further including a third etch to etch the natural oxide from said contact holes prior to said step of forming said wiring layer.

18. A method as in claim 16 wherein said substrate comprises silicon and said second etch step further includes an additional etch using one or more etch materials from the group comprising: $HNO_3$, HF, $CH_3COOH$, and $H_2O$.

19. A method as in claim 15 wherein said etches are wet etches.

20. A method as in claim 19 wherein said wet etches comprise an etch material from the group comprising: HF, $NH_4F$, and $CH_3COOH$.

21. A method as in claim 20 wherein said first etch and said second etch each comprises an etch with one part HF and six parts $NH_4F$, and said third etch comprises HF diluted with water.

22. A method as in claim 21 wherein said substrate comprises silicon and said second etch step further includes an additional etch using one or more etch materials from the group comprising: $HNO_3$, HF, $CH_3COOH$, and $H_2O$.

23. A method as in claim 15 wherein the contact hole size in said second mask pattern is equal to or smaller than the contact hole size of said first mask pattern.

24. A method as in claim 15 and further including an anneal step between said first etch step and said step of forming a wiring layer.

25. A method as in claim 24 wherein said anneal step is performed between said first and second etches.

26. A method as in claim 15 and further including the step of performing a first electrode anneal between said steps of forming said first electrode and forming said intermediate layer.

27. A method as in claim 15 and further including the step of performing a second insulating layer anneal between said steps of forming a second insulating layer and said step of performing a second etch.

28. A method as in claim 15 wherein said step of forming said wiring layer comprises the steps of depositing said metal wiring layer then annealing said integrated circuit at a temperature of between 350° C. and 600 ° C. for ten minutes or more in an atmosphere enriched in one or more gases of the group comprising nitrogen and hydrogen.

29. A method of fabricating an integrated circuit, said method comprising the steps of:

providing a substrate comprising silicon;

forming a transistor on said substrate, said transistor including an active area;

forming a first insulating layer overlying said transistor;

forming a capacitor on said first insulating layer without first providing a contact hole through said first insulating layer to said active area, said capacitor including a first electrode, an intermediate layer overlying said first electrode and comprising a material selected from a group consisting of ferroelectric materials and layered superlattice materials, and a second electrode overlying said intermediate layer; thereafter forming a second insulating layer overlying said capacitor;

forming contact holes to said active area and to at least one of said first electrode and said second electrode;

forming a wiring layer contacting said active area and one of either said first electrode or said second electrode; and said method further including an anneal step between said step of forming a second insulating layer and said step of forming a wiring layer.

30. A method of fabricating an integrated circuit as in claim 29 wherein said step of forming said second insulating layer comprises depositing a layer of spin-on glass, and said anneal step comprises hard baking said spin-on-glass at a temperature between of between 750° C. and 850° C. for a period of between 15 minutes and one hour.

31. A method of fabricating an integrated circuit as in claim 30 wherein said step of forming contact holes comprises the steps of partially opening said contact holes in a first process, and subsequently opening said contact holes completely in a second process, and wherein said step of hard baking takes place between said first process and said second process.

32. A method of fabricating an integrated circuit as in claim 29 wherein said step of forming contact holes comprises the steps of partially opening said contact holes in a first process, and subsequently opening said contact holes completely in a second process, and wherein said anneal step takes place between said first process and said second process.

33. A method of fabricating an integrated circuit, said method comprising the steps of:

providing a silicon substrate;

forming a transistor on said substrate, said transistor including a first active area;

forming a first insulating layer overlying said transistor, said first insulating layer comprising a material from the group comprising BPSG and SOG;

forming a first electrode overlying said first insulating layer without first providing a contact hole through said first insulating layer to said active area, said first electrode consisting essentially of platinum;

forming an intermediate layer overlying said first electrode and comprising a material selected from a group consisting of ferroelectric materials and layered superlattice materials;

forming a second electrode overlying said intermediate layer;

forming a second insulating layer overlying said capacitor, said second insulating layer comprising SOG;

forming a wiring layer making electrical contact with said active area and one of either said first electrode and second electrode, said wiring layer comprising platinum.

34. A method as in claim 33 wherein said first insulating layer comprises a relatively thick layer of BPSG covered by a relatively thin layer of SOG.

35. A method as in claim 33 wherein said second insulating layer comprises phosphosilicate SOG.

36. A method as in claim 33 wherein said wiring layer comprises a first wiring layer comprising platinum, a second wiring layer comprising titanium, and a third wiring layer comprising platinum.

37. A method as in claim 33 wherein said first wiring layer comprises platinum silicide.

38. A method as in claim 33 wherein said active area is formed in said silicon substrate and said first wiring layer of platinum silicide contacts said silicon substrate at said active area and said third wiring layer contacts said one of either said first electrode and said second electrode.

39. A method of fabricating an integrated circuit comprising:

providing a substrate comprising silicon;

forming a MOS device on said substrate;

forming a first insulating layer over said MOS device;

forming a second device over said first insulating layer without first providing a contact hole through said first insulating layer to said MOS device, said second device comprising a material selected from a group consisting of ferroelectric materials and layered superlattice materials;

forming a second insulating layer overlying said MOS device and said second device;

forming a first wiring layer contact hole through said first and second insulating layers to said MOS device and a second wiring layer contact hole through said second insulating layer to said second device;

forming a first wiring metal layer in at least one of said contact holes;

annealing said integrated circuit to improve the electrical characteristics of said MOS device;

forming a second wiring metal layer in one or more of said contact holes to connect said MOS device to said second device; and completing said integrated circuit.

40. A method of fabricating an integrated circuit as in claim 39 wherein said step of annealing comprises heating to 350° C. or more in an atmosphere enriched in one or more of the following gases: nitrogen, hydrogen, and oxygen.

41. A method of fabricating an integrated circuit as in claim 40 wherein said step of annealing comprises annealing in an atmosphere enriched in a mixture of nitrogen and hydrogen.

42. A method of fabricating an integrated circuit as in claim 39 wherein said first wiring metal layer comprises platinum.

43. A method of fabricating an integrated circuit as in claim 42 wherein said step of forming said first metal wiring layer comprises depositing a layer of platinum on said silicon substrate, and said step of annealing further comprises causing at least of portion of said platinum and said silicon to combine to form platinum silicide.

44. A method of fabricating an integrated circuit as in claim 39 wherein said second device comprises a ferroelectric layered superlattice material.

45. A method of fabricating an integrated circuit as in claim 44 wherein said ferroelectric layered superlattice material comprises strontium bismuth tantalate.

46. A method of fabricating an integrated circuit as in claim 39 and further including the step of etching said 1st wiring metal layer between said step of forming said first metal wiring layer and forming said second metal wiring layer.

* * * * *